(12) United States Patent
Nakura et al.

(10) Patent No.: US 6,836,428 B2
(45) Date of Patent: Dec. 28, 2004

(54) SEMICONDUCTOR MEMORY DEVICE INCLUDING SHADOW RAM

(75) Inventors: Takeshi Nakura, Tokyo (JP); Tohru Miwa, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 51 days.

(21) Appl. No.: 10/232,672

(22) Filed: Sep. 3, 2002

(65) Prior Publication Data

US 2003/0043618 A1 Mar. 6, 2003

(30) Foreign Application Priority Data

Sep. 4, 2001 (JP) ........................................ 2001-266933

(51) Int. Cl.[7] .............................................. G11C 14/00
(52) U.S. Cl. ........................ 365/154; 365/94; 365/104; 365/63
(58) Field of Search ........................ 365/154, 94, 104, 365/63

(56) References Cited

U.S. PATENT DOCUMENTS

| | | | | |
|---|---|---|---|---|
| 4,918,654 A | * | 4/1990 | Eaton et al. ................. | 365/145 |
| 5,737,260 A | * | 4/1998 | Takata et al. ................ | 365/145 |
| 5,926,412 A | * | 7/1999 | Evans et al. ................. | 365/145 |
| 5,930,161 A | * | 7/1999 | Sheikholeslami et al. ..... | 365/49 |
| 6,034,884 A | * | 3/2000 | Jung ........................... | 365/145 |
| 6,646,909 B2 | * | 11/2003 | Miwa et al. ................. | 365/154 |
| 6,661,695 B2 | * | 12/2003 | Fisch .......................... | 365/145 |
| 6,707,702 B1 | * | 3/2004 | Komatsuzaki .............. | 365/145 |
| 2002/0126522 A1 | * | 9/2002 | Miwa et al. ................. | 365/154 |

FOREIGN PATENT DOCUMENTS

| | | | | | |
|---|---|---|---|---|---|
| JP | 402122522 A | * | 5/1990 | ........... | H01L/21/28 |
| JP | 2000-293989 | | 10/2000 | | |
| JP | 02000293989 A | * | 10/2000 | ........... | G11C/14/00 |
| JP | 02002109875 A | * | 4/2002 | ........... | G11C/11/22 |

* cited by examiner

Primary Examiner—Viet Q. Nguyen
(74) Attorney, Agent, or Firm—Young & Thompson

(57) ABSTRACT

There is provided a semiconductor memory device for preventing an increase of a cell area of a Shadow RAM comprising a portion of an SRAM memory cell and a ferroelectric capacitor connected to a storage node of the portion of the SRAM memory cell and achieving high capacitance formation of a storage capacitor. The Shadow RAM is provided with a relay wiring layer between a wiring layer corresponding to the storage node and a lower electrode of the ferroelectric capacitor, a wiring corresponding to the storage node is connected to a relay wiring via a first and a second opening portion arranged at a first interval and the lower electrode of the ferroelectric capacitor is connected to a relay wiring via a third and a fourth opening portion arranged at a second interval narrower than the first interval.

10 Claims, 18 Drawing Sheets

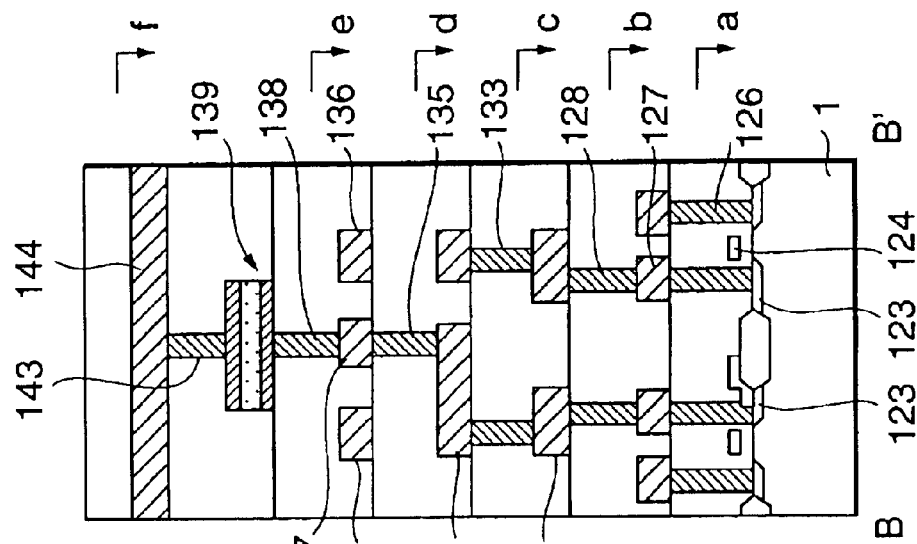
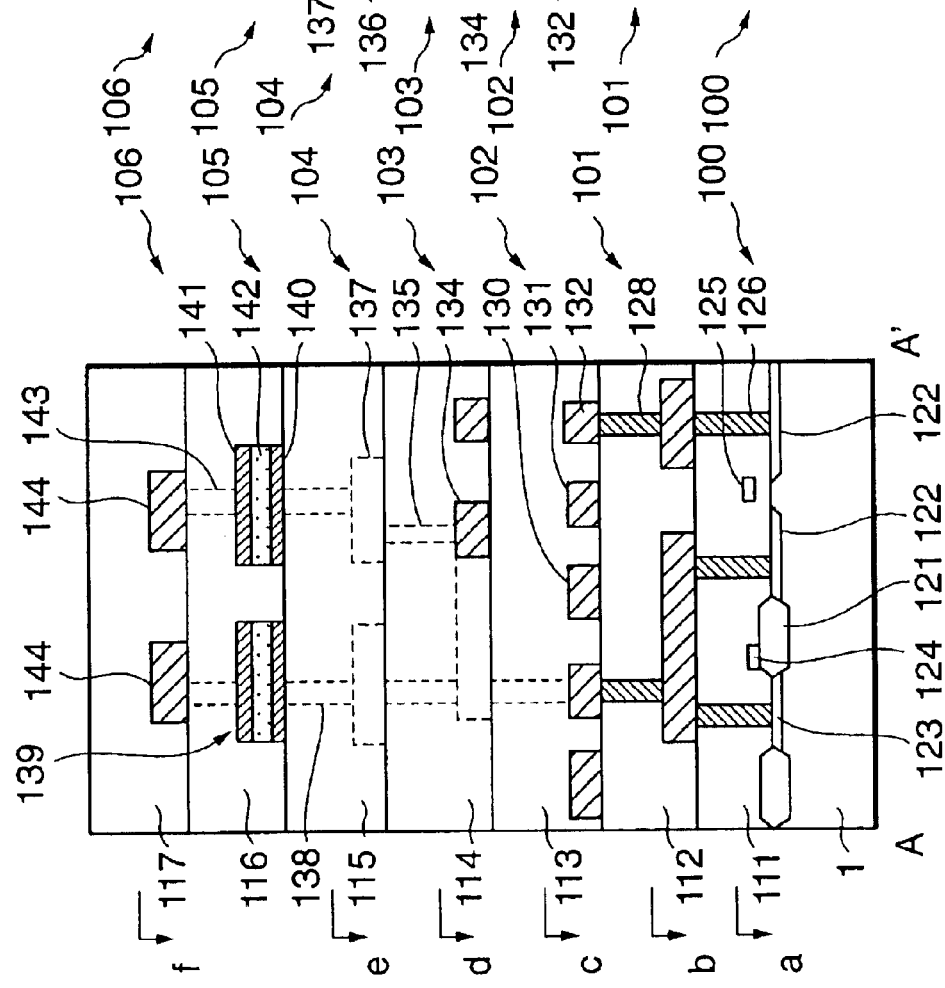

ALLOCATION OF RESPECTIVE WIRINGS

|  | WORD LINE | BIT LINE | POWER SOURCE LINE | GND LINE | LEAD WIRE TO CAPACITOR |
|---|---|---|---|---|---|
| SRAM | POLYSILICON/SECOND WIRING LAYER | THIRD WIRING LAYER | SECOND WIRING LAYER | SECOND WIRING LAYER | — |
| CONVENTIONAL TYPE SHADOW RAM | POLYSILICON/SECOND WIRING LAYER | THIRD WIRING LAYER | SECOND WIRING LAYER | SECOND WIRING LAYER | THIRD WIRING LAYER |
| INVENTED SHADOW RAM | POLYSILICON/SECOND WIRING LAYER | FOURTH WIRING LAYER | SECOND WIRING LAYER | SECOND WIRING LAYER | THIRD WIRING LAYER |

FIG. 5B

OTHER EXAMPLE OF ALLOCATION OF RESPECTIVE WIRINGS

| WORD LINE | BIT LINE | POWER SOURCE LINE | GND LINE | LEAD WIRE TO CAPACITOR |
|---|---|---|---|---|
| POLYSILICON/SECOND WIRING LAYER | THIRD WIRING LAYER | FOURTH WIRING LAYER | FOURTH WIRING LAYER | FOURTH WIRING LAYER |
| POLYSILICON/SECOND WIRING LAYER | FOURTH WIRING LAYER | THIRD WIRING LAYER | THIRD WIRING LAYER | THIRD WIRING LAYER |

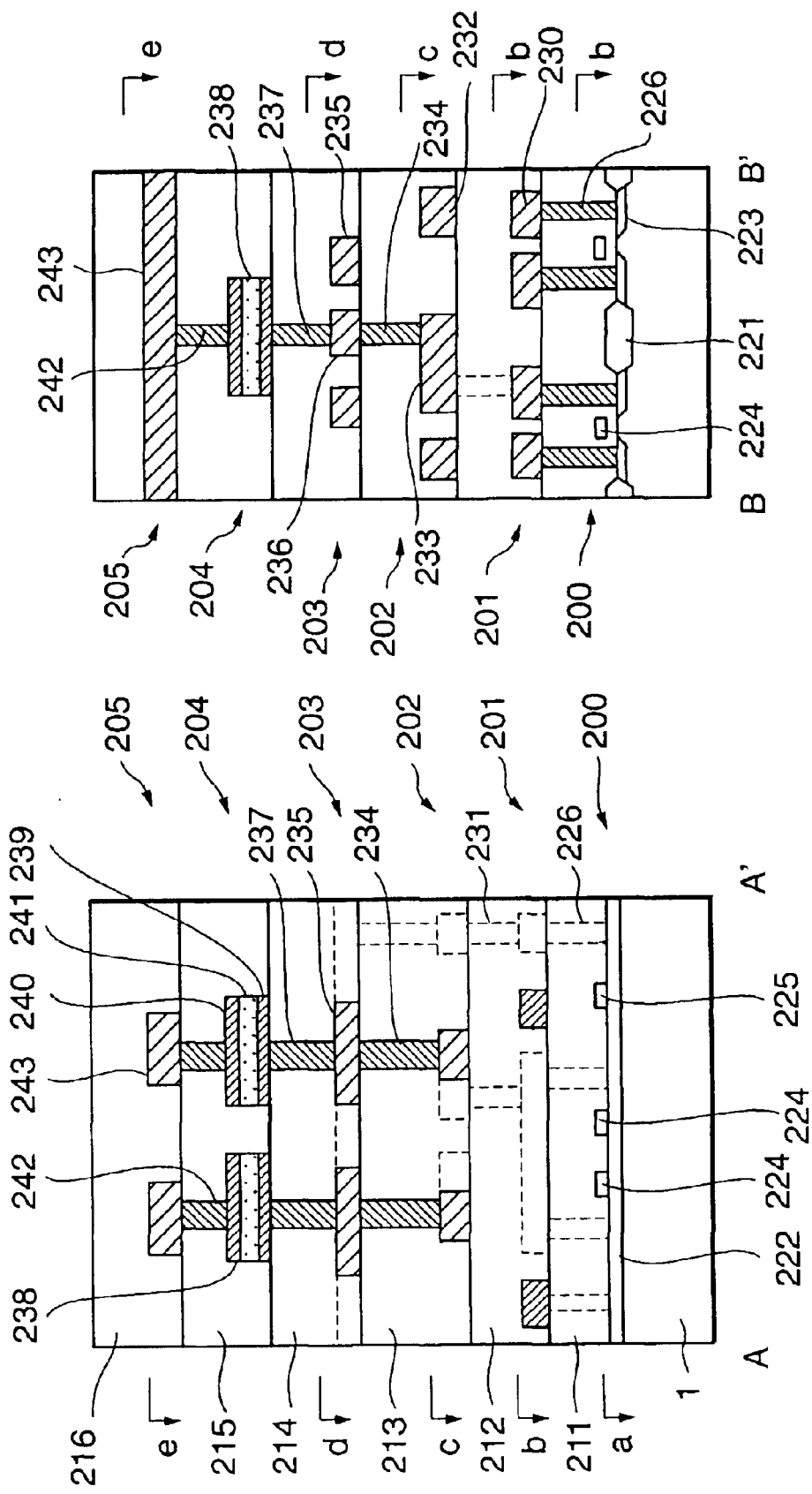

ALLOCATION OF RESPECTIVE WIRINGS

| | WORD LINE | BIT LINE | POWER SOURCE LINE | GND LINE | LEAD WIRE TO CAPACITOR |
|---|---|---|---|---|---|
| SRAM | POLYSILICON/FIRST WIRING LAYER | SECOND WIRING LAYER | FIRST WIRING LAYER | SECOND WIRING LAYER | — |
| CONVENTIONAL TYPE SHADOW RAM | POLYSILICON/FIRST WIRING LAYER | SECOND WIRING LAYER | FIRST WIRING LAYER | FIRST WIRING LAYER | FIRST WIRING LAYER |
| INVENTED SHADOW RAM | POLYSILICON/FIRST WIRING LAYER | THIRD WIRING LAYER | FIRST WIRING LAYER | SECOND WIRING LAYER | SECOND WIRING LAYER |

FIG. 9B

OTHER EXAMPLE OF ALLOCATION OF RESPECTIVE WIRINGS

| WORD LINE | BIT LINE | POWER SOURCE LINE | GND LINE | LEAD WIRE TO CAPACITOR |
|---|---|---|---|---|
| POLYSILICON/FIRST WIRING LAYER | SECOND WIRING LAYER | THIRD WIRING LAYER | THIRD WIRING LAYER | FIRST WIRING LAYER |
| POLYSILICON/FIRST WIRING LAYER | THIRD WIRING LAYER | SECOND WIRING LAYER | SECOND WIRING LAYER | SECOND WIRING LAYER | a-a b-b c-c

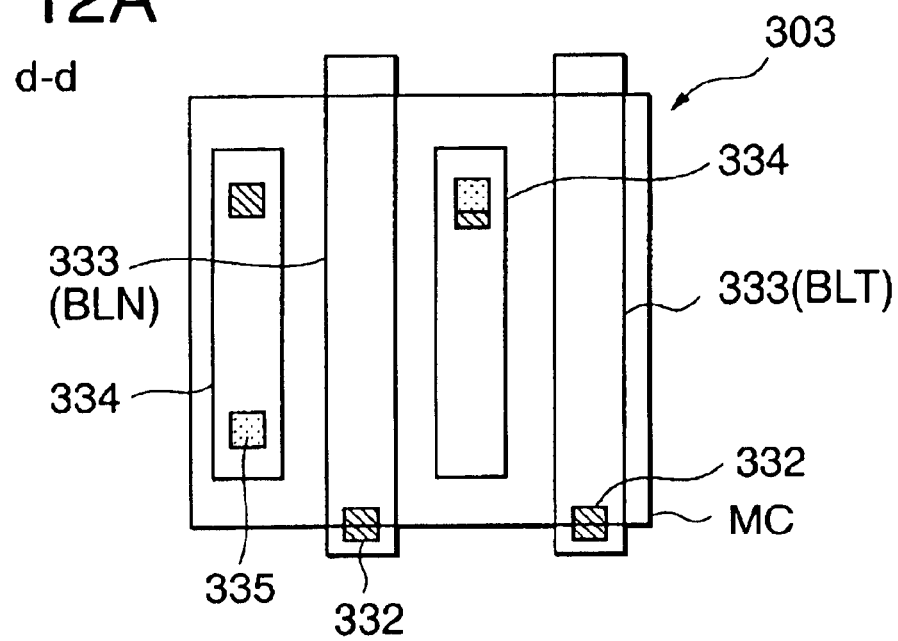
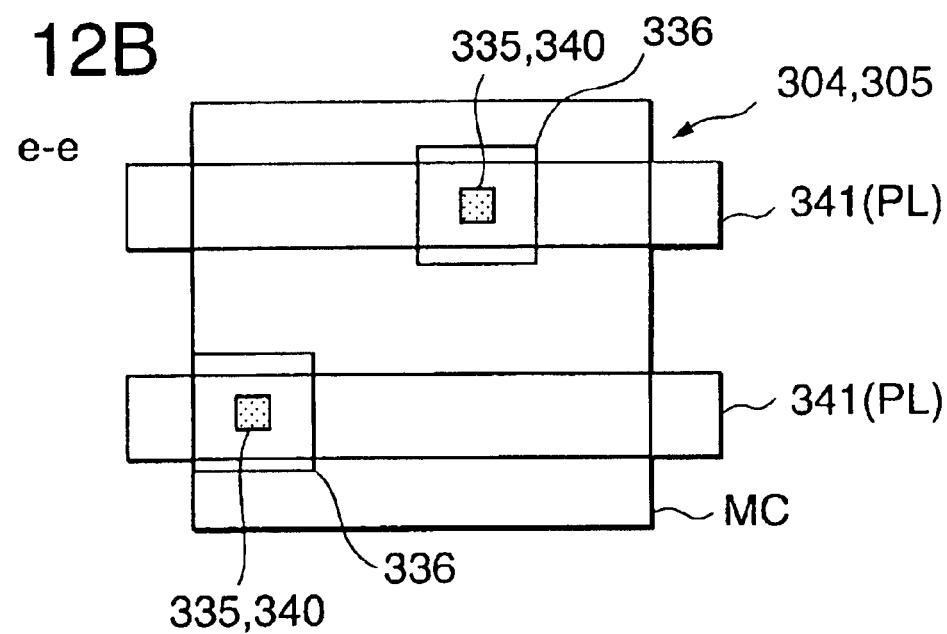

a-a b-b

FIG. 16A a-a
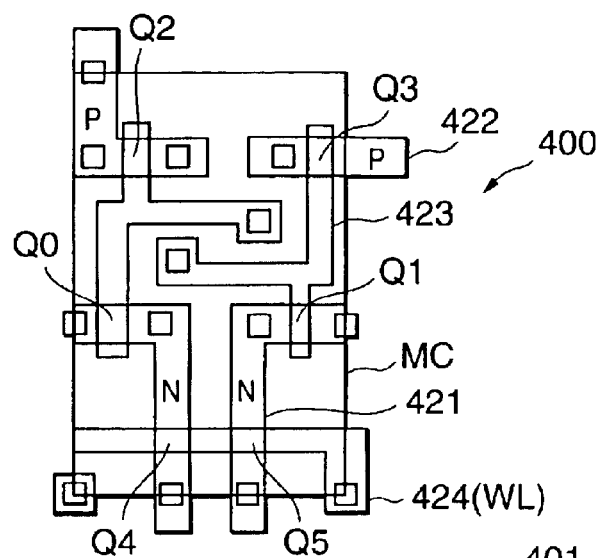
FIG. 16B b-b
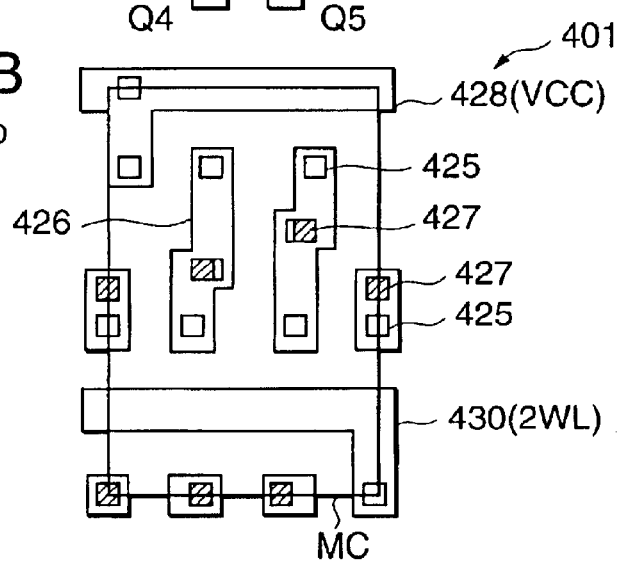
FIG. 16C c-c
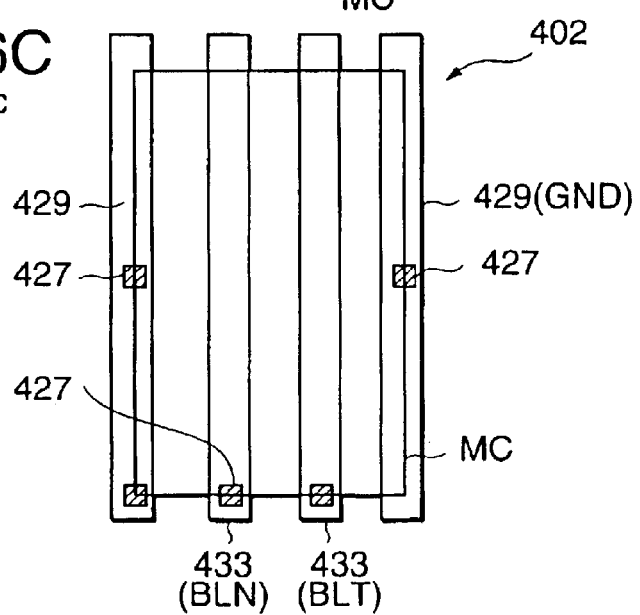

a-a b-b

SEMICONDUCTOR MEMORY DEVICE INCLUDING SHADOW RAM

BACKGROUND OF THE INVENTION

1. Field of the Invention

The present invention relates to a Static Random Access Memory (SRAM), particularly to a Shadow RAM having a memory cell constituted by adding a ferroelectric capacitor to SRAM for reading and writing an SRAM cell at high speed when power is supplied and keeping nonvolatile storage in the ferroelectric capacitor when power is not supplied.

2. Description of the Prior Art

A conventional Static Random Access Memory (SRAM) includes a flip flop by two of inverters of CMOS as shown by, for example, a circuit diagram of FIG. 1A. Further, drains of NMOS transistors Q0 and Q1 constituting the flip flop, are made to constitute storage nodes N0 and N1. The two storage nodes N0 and N1 are connected to a negative bit line BLN and a positive bit line BLT via NMOS transistors Q4 and Q5 respectively functioning as transfer gates. Respective gates of the NMOS transistors Q4 and Q5 constituting the transfer gates, are connected to a common word line WL. The negative bit line BLN and the positive bit line BLT are paired and a sense amplifier, not illustrated, for comparing and amplifying voltages of the two bit lines, is connected therebetween.

Meanwhile, a Shadow RAM is constituted by adding ferroelectric capacitors to the storage nodes N0 and N1 of the above-described SRAM (hereinafter, simply referred to as SRAM). FIG. 1B is a circuit diagram of an example of a Shadow RAM described in Japanese Patent Laid-Open No. 2000-293989. Portions the same as those of SRAM shown in FIG. 1A are designated by the same notations and an explanation thereof will be omitted. According to the Shadow RAM, respective ends on one side of the ferroelectric capacitors F0 and F1 are connected to the two storage nodes N0 and N1 and both of ends on other side of the respective ferroelectric capacitors F0 and F1 are connected to a plate line PL. The plate line PL is connected to a plate line drive circuit outside of the drawing.

When power is supplied, the Shadow RAM is set to ½ of power source voltage Vcc, that is, Vcc/2 and reading and writing data executed in supplying power, are carried out similar to a conventional general SRAM. When power source is cut, there is carried out store operation of switching to shift data stored by the flip flop to polarizing directions of the ferroelectric capacitors F0 and F1. In a store period of time, stored data is stored as directions of remanent polarization of the ferroelectric capacitors F0 and F1 by driving the plate line PL to Vcc/2 to Vcc, further to 0V while maintaining the word line W in an inactivated state. Further, when power source is started, there is carried out recall operation of switching to shift data held by the ferroelectric capacitors to the flip flop. In a recall period of time, data stored by the ferroelectric capacitors as remanent polarization is reproduced to the flip flop by starting the power source of the flip flow while maintaining the word line WL and the plate line P1 in an inactivated state. In this way the Shadow RAM can function as a nonvolatile memory by which data stored by the flip flop is preserved even after having been subjected to cutting and restarting power source and in the meantime, reading and writing data can be carried out similar to the conventional SRAM.

In order to form such a Shadow RAM on a semiconductor substrate (silicon substrate), it is necessary to form the ferroelectric capacitor at a layer as upper as possible. Because in a ferroelectric capacitor, a ceramic thin layer is generally used as a dielectric insulating film between a lower electrode and an upper electrode and since the ferroelectric film is made of an oxide, when the ferroelectric film is exposed to a deoxidizing atmosphere, oxygen deficiency is brought about, resistance is reduced, leak current between electrodes is increased and a reduction in a ferroelectric polarizing amount, a reduction in a dielectric constant and a deterioration in other electric properties are brought about. Therefore, the ferroelectric capacitor is arranged at an uppermost layer of a multilayer wiring structure to be able to be formed after various metals of wiring layers have been formed such that the ferroelectric capacitor is not exposed to the deoxidizing atmosphere.

A sectional view of FIG. 10 shows a section taken along a line AA' of FIG. 11A and respective views of FIGS. 11A, 11B and 11C and FIGS. 12A and 12B are views viewed along lines a through e of the sectional view. In FIG. 10, there is constructed a constitution in which a transistor level 300 formed with an MOS transistor is provided on a silicon substrate 1 and above the transistor level 300, there are provided multilayers of wiring layers successively laminated and formed with a first interlayer insulating film 311, a first wiring level 301, a second interlayer insulating film 312, a second wiring level 302, a third interlayer insulating film 313, a third wiring level 303, a fourth interlayer insulating film 314, a ferromagnetic capacitor level (a fourth wiring level) 304, a fifth interlayer insulating film 315, a fifth wiring level 305, and a passivation film 316.

FIG. 11A shows the transistor layer 300 comprising an N-type diffusion layer 321 and a P-type diffusion layer 322 and polysilicon wirings of a gate electrode 323 and a word line (WL) 324 formed at the silicon substrate 1. FIG. 11B shows the first wiring level 301 comprising a first relay wiring 326 connected to the respective diffusion layers 321 and 322 of the transistor layer 300 via a first plug 325. Further, the plug connects the upper layer 326 and the lower layers 321 and 322 to each other by filling a conductive material to a contact formed at the interlayer insulating film. FIG. 11C shows the second wiring level 302 comprising a power source line (Vcc) 328 connected to the first wiring level 301 by a second plug 327, a GND line 329, a second word line (WL) 330 connected in parallel with the word line 324 of the transistor layer 300 to reduce resistance of a total of the word line, and a second relay wiring 331 connected to the first relay wiring 326.

FIG. 12A shows the third wiring level 303 comprising bit lines (BLN, BLT) 333 connected to the second wiring level 302 by a third plug 332, a third relay wiring 334 connected to the second relay wiring 331. FIG. 12B shows the fourth wiring level 304 comprising a ferroelectric capacitor 336 connected to the third relay wiring 334 by a fourth plug 335, and the fifth wiring level 305 comprising a plate line (PL) 341 of an upper layer by a fifth plug 340 further thereabove. The ferroelectric capacitor 336 is constituted by a laminated layer structure of a lower electrode 337, a ferroelectric insulating film 338 and an upper electrode 339, the lower electrode 337 is connected to the third relay wiring 334 and the upper electrode 334 is connected to the plate line 341.

In this way, according to the above-described Shadow RAM (hereinafter, referred to as conventional type Shadow RAM), in order that the ferroelectric capacitors 336 are connected to the respective storage nodes N0 and N1 of the NMOS transistors Q0 and Q1 constituting the inverters, there is formed a structure in which the transistor layer 300 is connected to the lower electrode 337 of the ferroelectric capacitor 336 via the first through the fourth interlayer insulating films 311 through 334. That is, respectives of the first through the third wiring level 301 through 303 are formed with the first through the third relay wirings 326, 331 and 334 and the first through the fourth interlayer insulating films 311 through 314 are formed with the plugs 325, 327, 332 and 335.

In this way, according to the Shadow RAM, the first through third wiring levels 301 through 303, there is needed a space for arranging the respective relay wirings 326, 331 and 334 in addition to wirings needed for constituting SRAM and a cell area requested for a single memory cell MC is enlarged. As a result, there is constituted a hazard in achieving high capacitance formation of the storage capacitor of the Shadow RAM.

An explanation will be given of a structure of SRAM shown in FIG. 1A in reference to FIG. 13 through FIG. 15B for comparison. FIG. 13 is a vertical sectional view thereof, FIGS. 14A and 14B and FIGS. 15A and 15B are layout views viewed along lines a through d there of and there is constituted SRAM of a four-layers structure. In FIG. 13, there is constructed a constitution in which there is provided a transistor layer 400 formed with an MOS transistor on a silicon substrate 1, above the transistor layer 400, there is provided multilayers of wiring layers successively laminated with a first interlayer insulating film 411, a first wiring layer 401, a second interlayer insulating film 412, a second wiring layer 402, a third interlayer insulating film 413, a third wiring layer 403, and a passivation film 414.

FIG. 14A shows the transistor layer 400 having an N-type diffusion layer 421 and a P-type diffusion layer 422 formed at the silicon substrate 1 and polysilicon wiring of a gate electrode 423 and a word line 424. FIG. 14B shows the first wiring layer 401 comprising a first relay wiring 426 connected to the respective diffusion layers 421 and 422 of the transistor layer 400 via a first plug 425. FIG. 15A shows the second wiring layer 402 comprising a power source line (Vcc) 428 and a GND line 429 connected to the first relay wiring 426 via a second plug 427, a second word line (2 WL) 430 connected in parallel with the work line 424 of the transistor layer 400 for reducing resistance of a total of the work line and a second relay wiring 431. FIG. 15B is a third wiring layer 403 comprising bit lines (BLN, BLT) 433 connected to the second relay wiring 431 via a third plug 432.

When respective layers of SRAM of the four-layer structure and conventional type Shadow RAM are compared, it is known that in the case of the conventional type Shadow RAM, other than the power source line 328, the GND line 329 and the second word line 330, there is needed the second relay wiring 331 as an extra of a number of the wirings in the second wiring layer 402 of SRAM shown in FIG. 13 and other than the bit lines 333 in the third wiring level 303, there is needed the third relay wiring 334 as an extra of a number of the wirings in the third wiring level 303 of SRAM. It is possible in design to constitute a Shadow RAM by arranging wirings in correspondence with the second relay wiring and the third relay wiring needed as extras in the Shadow RAM respectively at the second wiring layer and the third wiring layer without changing the layout in SRAM of the four-layers structure. However, an interval between contiguous wirings is narrowed, and there is not provided a margin in forming a wiring layer in the photolithography technology to thereby cause shortcircuit between contiguous wirings. Particularly, in the third wiring layer, whereas in the case of SRAM, two pieces of the bit lines are aligned, in the case of the conventional type Shadow RAM, there are arranged the third relay wirings 334 to be electrically connected to the ferroelectric capacitors at the upper layer in a state of being provided along respectives of two pieces of the paired bit lines 333 and therefore, it is requested to increase the interval between the bit lines by that amount. Therefore, in accordance with increasing the interval between the bit lines, there is changed the layout of all the wiring layers including the transistor layer at the lowermost layer and in view of a length LW in a direction of extending the word line and a length LB in a direction of extending the bit line, the length LW in the direction of extending the word line of the Shadow RAM, becomes longer than a length of a memory cell of SRAM and a cell area of the memory cell above the semiconductor substrate is increased in comparison with that of SRAM. Further, by increasing the cell area of the memory cell, it is necessary to change a peripheral circuit of the memory cell such as a decoder, a sense amplifier and the like a scale of changing in design is enlarged and a number of design steps is increased.

Further, as illustrated in FIGS. 16A, 16B and 16C, there is proposed SRAM of a three-layers wiring structure reducing a number of layers. In the case of SRAM of the three-layers wiring structure, while a cell area of a memory cell thereof is made more or less larger than the cell area of SRAM shown in FIG. 13 through FIG. 15C, a number of wiring levels is reduced. The same notations are attached to portions of layout views of respective layers illustrated in FIGS. 16A, 16B and 16C equivalent to those of SRAM illustrated in FIG. 13 through FIG. 15C. FIG. 16A shows a transistor layer 400 having the respective N-type and P-type diffusion layers 421 and 422 formed at the silicon substrate 1 and the polysilicon wirings of the gate electrode 423 and the word line 424. FIG. 16B shows a first wiring layer 401 comprising the power source line 428, the second word line 430, and the first relay wiring 426 connected to the respective diffusion layers 421 of the transistor layer 400 via the first plug 425. FIG. 16C shows a third wiring layer 403 comprising the GND line 429 and the bit lines 433 connected via the first relay wiring 426.

FIGS. 17A and 17B and FIGS. 18A and 18B show layout views of a Shadow RAM in contrast to SRAM of the three-layers structure. Further, the same notations are attached to portions equivalent to those of FIG. 10 through FIG. 12B. FIG. 17A shows a transistor layer 300 having the respective N-type and P-type diffusion layers 321 and 322 formed at the silicon substrate 1 and the polysilicon wirings of the gate electrode 323 and the word line 324. FIG. 17B shows a first wiring level 301 comprising the power source line (Vcc) 328 and the GND line 329 connected to the diffusion layers 321 and 322 of the transistor layer 300 via the first plug 325, the second word line (2 WL) 330 and the first relay wiring 326. FIG. 18A shows a second wiring level 302 comprising the bit lines (BLN, BLT) 333 and the second relay wiring 334 connected to the first relay wiring 326 via the second plug 327. FIG. 18B shows a third wiring level 303 comprising the ferroelectric capacitor 336 connected to the second relay wiring 334 via the third plug 332 and a fourth wiring level 304 formed thereabove and comprising the plate line (PL) 341 connected to the ferroelectric capacitor 336 via the fourth plug 340. Although not illustrated in the drawing, the ferroelectric capacitor 336 is constituted by a laminated structure of a lower electrode, a ferroelectric insulating film and an upper electrode, the lower electrode is connected to the second relay wiring 334 and the upper electrode is connected to the plate line 341.

When the conventional type Shadow RAM is constituted by utilizing SRAM of the three-layers wiring structure, at the first wiring level 301, whereas the GND line is not present in SRAM, in the case of the conventional type Shadow RAM, the GND line 329 is arranged along with the power source line 328 and the second word line 330. This is because the relay wiring 334 to be connected to the ferroelectric capacitor, is provided at the second wiring level 302. Therefore, there is constituted a layout of a memory cell MC having a size LB in a direction of extending the bit line longer than that of SRAM of the three-layers wiring structure and the cell area of the memory cell MC is increased. This also constitutes a hindrance in achieving high capacity formation of a storage capacitor similar to the conventional type Shadow RAM described above.

SUMMARY OF THE INVENTION

It is an object of the invention to provide a semiconductor memory apparatus for preventing an increase in a cell area of a memory cell of a Shadow RAM and achieving high capacity formation of a storage capacitor.

Further, it is an object of the invention to provide a semiconductor memory apparatus capable of designing a Shadow RAM by utilizing design data of a wiring layer of a transistor applied to an SRAM which has been generally used conventionally, as it is.

Further, it is an object of the invention to provide a semiconductor memory apparatus achieving a reduction in a number of steps of design of a Shadow RAM and shortening of a design period of time and having a large storage capacity.

A semiconductor memory apparatus according to the invention includes an SRAM memory cell and a Shadow RAM memory cell. The Shadow RAM memory cell is provided with a ferroelectric capacitor at the SRAM memory cell and is constituted such that an area of the Shadow RAM memory cell is equal to an area of the memory cell of SRAM.

Further, a semiconductor memory apparatus according to the invention at least includes a Shadow RAM having a ferroelectric capacitor at an SRAM memory cell, the Shadow RAM includes a relay wiring layer and two storage nodes of a portion of the SRAM memory cell is connected to the low electric capacitor respectively via a relay wiring of the relay wiring layer and an opening portion. The respective storage nodes and the relay wiring of the relay wiring layer are connected via a first and a second opening portion and the relay wiring and a lower electrode of the ferroelectric capacitor are connected via a third and a fourth opening portion. The relay wiring is provided to make a distance between the third and the fourth opening portions narrower than the distance between the first and the second opening portions.

That is, the relay wiring layer is provided, the relay wiring layer is formed with the relay wiring for connecting an upper layer wiring layer and a lower layer wiring layer in an arbitrary pattern shape and a position of an opening portion for connecting the upper layer wiring layer connected to the relay wiring and a position of an opening portion for connecting the lower layer wiring are set to different arbitrary positions. Thereby, the respective nodes and the lower electrode of the ferroelectric capacitor can be connected without changing almost all data of a wiring layer applied to SRAM which has been generally used conventionally.

Further, the invention is characterized in that a peripheral circuit for driving SRAM and Shadow RAM is commonly used. In this case, there is constructed a constitution in which SRAM and Shadow RAM are present to mix in a memory cell region. Further, a memory cell region constituted by Shadow RAM and a memory cell region constituted by SRAM in either one of a bit line direction or a word line direction, are made the same size.

According to the invention, a number of wiring levels is increased more than that of wiring layers of conventional type Shadow RAM, at the increased wiring layer, a relay wiring for connecting a wiring layer at an upper layer and a wiring layer at a lower layer is formed in an arbitrary shape and a connection structure for connecting the wiring layer at the lower layer and the connection structure for connecting to the wiring layer at the upper layer can be set to different arbitrary positions. Therefore, Shadow RAM can be realized even when layouts of the wiring layer at the upper layer and the wiring layer at the lower layer of the conventional type Shadow RAM are maintained to layouts the same as layouts of corresponding wiring layers of a memory cell of SRAM and the Shadow RAM of the invention can be realized while maintaining a size thereof the same as that of the memory cell of SRAM. Further, by commonly using a peripheral circuit, a semiconductor memory apparatus can easily be designed by substituting a memory cell region of conventional SRAM to Shadow RAM as it is.

BRIEF DESCRIPTION OF THE DRAWINGS

The above and other objects, advantages and features of the present invention will be more apparent from the following description taken in conjunction with the accompanying drawings, in which:

FIGS. 2A and 2B are vertical sectional views of Shadow RAM according to a first embodiment of the invention;

FIGS. 5A and 5B are tables showing allocation of wirings at respective wiring layers according to the first embodiment;

FIGS. 6A and 6B are vertical sectional views of Shadow RAM according to a second embodiment of the invention;

FIGS. 9A and 9B are tables showing allocation of wirings at respective wiring layers according to the second embodiment;

FIGS. 12A and 12B are layout views of layers along respective lines d and e of FIG. 10;

FIGS. 16A through 16C are respective layout views of a transistor layer through a second wiring layer of different conventional SRAM;

DETAILED DESCRIPTION OF THE PREFERRED EMBODIMENTS

Figure 1A:
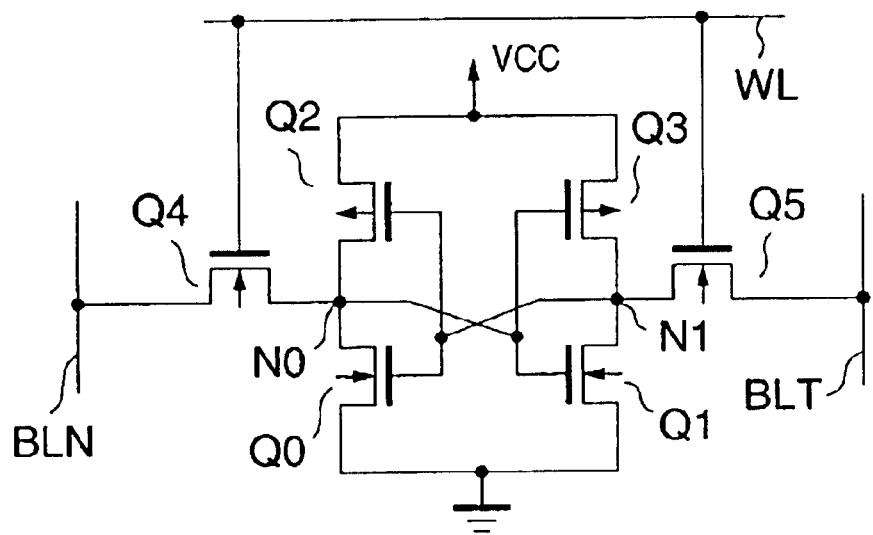
FIGS. 1A and 1B are circuit diagrams of SRAM and Shadow RAM.
Figure 1B:
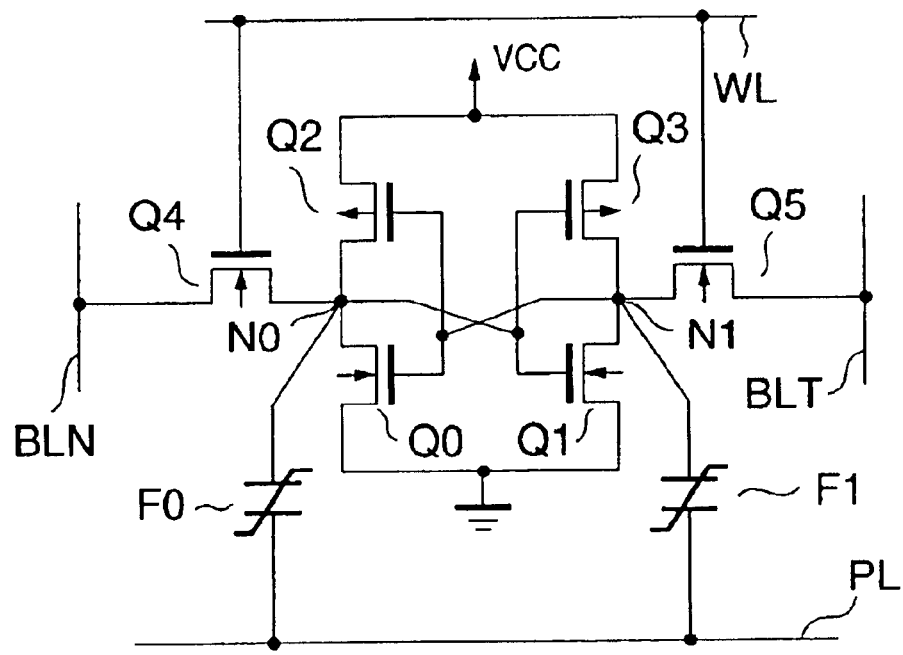

Next, an explanation will be given of embodiments of the invention in reference to the drawings. FIG. 2A through FIG. 4C show an example of applying the invention to SRAM of a four-layers structure explained in the conventional technology. Further, sectional views of FIGS. 2A and 2B are sectional views of portions taken along a line AA' and a line BB' of FIG. 3A through 4C and respective layout views of FIG. 3A through FIG. 4C, show layouts viewed along lines a through f of FIGS. 2A and 2B. As shown by FIGS. 2A and 2B, above the silicon substrate 1, there are laminated a transistor layer 100, a first wiring level 101, a second wiring level 102, a third wiring level 103, a fourth wiring level 104, a fifth wiring level 105, and a sixth wiring level 106 via a first through a sixth interlayer insulating film 111 through 116. A topmost layer is a passivation film 117.

Figure 3A:
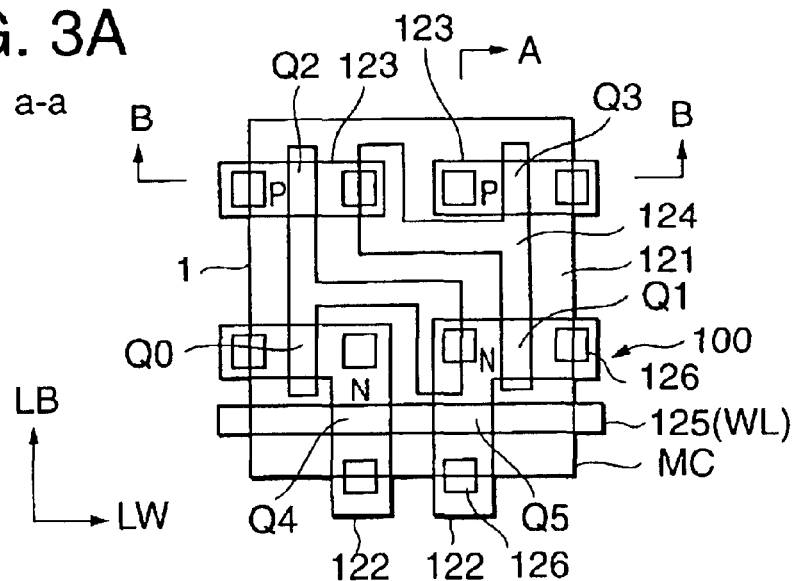
FIGS. 3A, 3B and 3C are layout views of layers along respective lines a, b, and c of FIGS. 2A and 2B.

FIG. 3A is a view showing a transistor layer 100, at inside of a region of one memory cell MC of the silicon substrate 1, there is formed a transistor region by selectively forming an element isolation insulating film 121 by LOCOS method, thereafter, an N-type impurity of arsenic, phosphor or the like is introduced to a partial region of the transistor region to thereby form an N-type diffusion layer 122 and other region is formed with a P-type diffusion layer 123 by introducing a P-type impurity of boron or the like. Further, a gate oxide film and a polysilicon film are formed at a surface of the silicon substrate 1 and thereafter, the polysilicon film and the gate oxide film are formed by predetermined patterns by a photolithography step to thereby form a gate electrode 124 and a word line (WL) 125. Thereby, there is formed the transistor layer 100 having PMOS transistors Q2 and Q3 constituting sources and drains thereof by the P-type diffusion layers 123, NMOS transistors Q0 and Q1 constituting sources and drains thereof by the N-type diffusion layer 122 and NMOS transistor Q4 and Q5 constituting gate transistors (transfer gates).

Figure 3B:
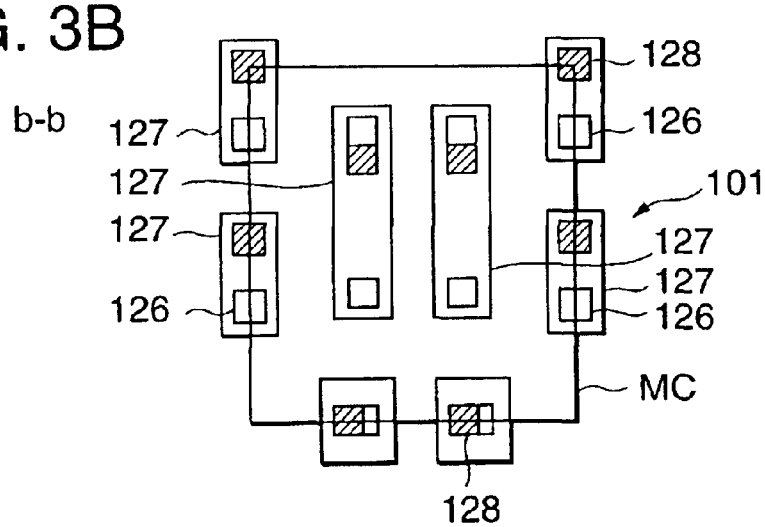

FIG. 3B is a view showing the first wiring level 101, and the first interlayer insulating film 111 of a silicon oxide film is formed on the transistor layer 100. Further, the first interlayer insulating film 111 is provided with openings at regions thereof above the N-type diffusion layer 122 and the P-type diffusion layer 123 and a conductive material of tungsten or the like is embedded in the opening to thereby form a first plug 126. Next, an aluminum film or an aluminum alloy film is formed on the first interlayer insulating film 111, formed into a necessary pattern shape by a photolithography step to thereby form the first wiring level 101. The first wiring level 101 is formed as the first relay wiring 127 and the respective first relay wiring 117 is connected to the N-type diffusion layer 122 and the P-type diffusion layer 123 of the transistor layer 100 by the first plug 126.

Figure 3C:
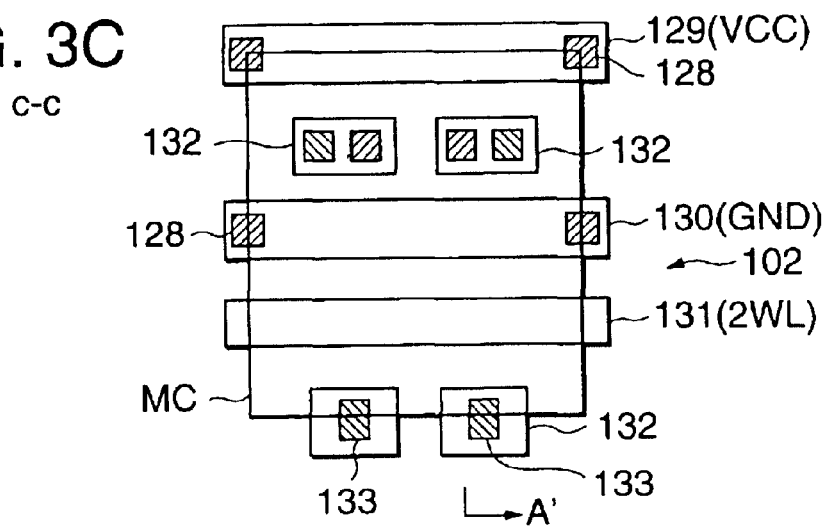

FIG. 3C is a view showing the second wiring level 102 and the second interlayer insulating film 112 of a silicon oxide film is formed on the first wiring level 101. Further, the second interlayer insulating film 112 is provided with an opening at a region above the first relay wiring and a conductive material of tungsten or the like is embedded in the opening to thereby form a second plug 128. Next, an aluminum film or an aluminum alloy film is formed on the second interlayer insulating film 112 and is formed in a necessary pattern shape by a photolithography step to thereby form the second wiring level 102. The second wiring level 102 is formed to constitute a power source line (Vcc) 129, a GND line 130, a second word line (2 WL) 131 and a second relay wiring 132, which are respectively connected to the first relay wiring 127 by the second plug 128. Further, the second word line 131 is formed in parallel with the word line 125 of the polysilicon layer 100 and also the word lines are electrically connected to each other at a region outside of the drawing to thereby achieve low resistance formation of a total of the word line.

Figure 4A:
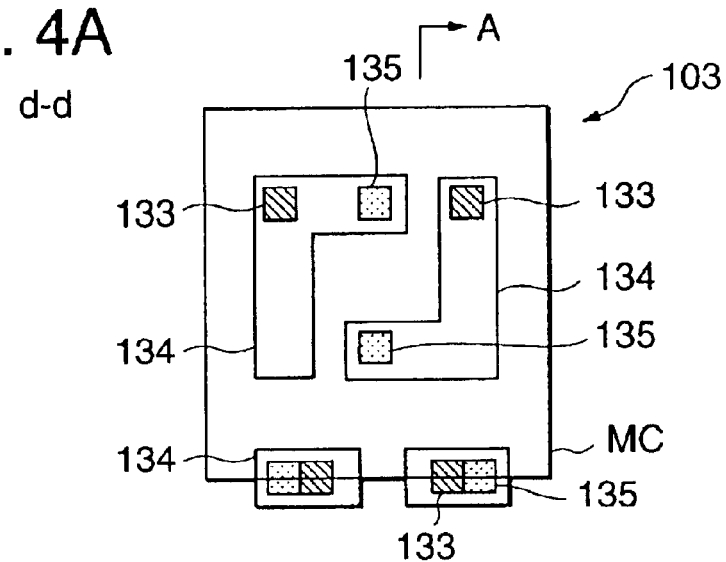
FIGS. 4A through 4C are layout views of layers along respective lines d, e and f of FIGS. 2A and 2B.

FIG. 4A is a view showing the third wiring level 103 and the third interlayer insulating film 113 of a silicon oxide film is formed on the second wiring level 102. Further, the third interlayer insulating film 113 is provided with an opening at a region above the second relay wiring 132 and a conductive material of tungsten or the like is embedded in the opening to thereby form the third plug 133. Next, a laminated film of an aluminum or an aluminum alloy film and titanium or titanium nitride is formed on the third interlayer insulating film 113 and formed in a necessary pattern shape by a photolithography step to thereby form the third wiring level 103. The third wiring level 103 is formed to constitute a third relay wiring 134 and is connected to the second relay wiring 132 by the third plug 133. The third relay wiring 134 is formed in an L-like pattern shape to make an interval between fourth plugs 135, mentioned later, for connecting to the fourth wiring level 104 at an upper layer in a direction of extending the word line narrower than an interval between the third plugs 133 for connecting to the second wiring level 102 at a lower layer as so-to-speak lead wiring. In other words, the third relay wiring 134 is formed in a shape capable of being arranged at a space between wirings formed at the fourth wiring level 104.

Figure 4B:
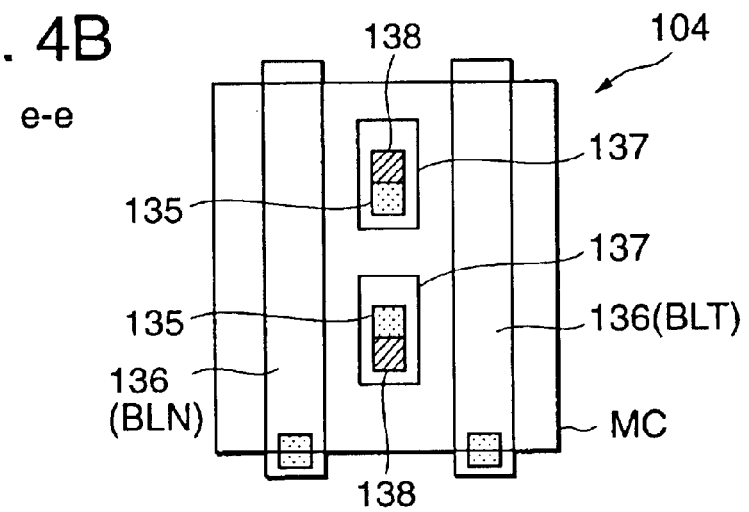

FIG. 4B is a view showing the fourth wiring level 104 and the fourth interlayer insulating film 114 of a silicon oxide film is formed on the third wiring level 103. Further, the fourth interlayer insulating film 114 is provided with an opening at a region above the third relay wiring 134 and a conductive material of tungsten or the like is embedded in the opening to thereby form the fourth plug 135. Next, an aluminum film or an aluminum alloy film is formed on the fourth interlayer insulating film 114 and is formed in a necessary pattern shape by a photolithography step to thereby form the fourth wiring level 104. The fourth wiring level 104 is formed to constitute bit lines (BLN, BLT) 136 and a third relay wiring 137, which are connected to the third relay wiring 134 by the fourth plug 135.

Figure 4C:
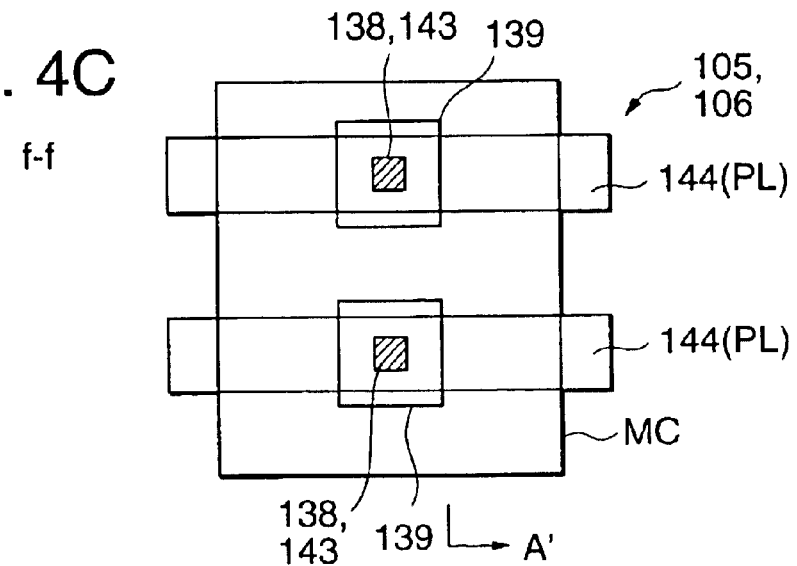

FIG. 4C is a view summarizingly showing the fifth wiring level 105 and the sixth wiring level 106 and the fifth interlayer insulating film 115 of a silicon oxide film is formed on the fourth wiring level 104. Further, the fifth interlayer insulating film 115 is provided with an opening at a region above the fourth relay wiring 137 and a conductive material is embedded in the opening to thereby form a fifth plug 138. Next, the fifth wiring level 105 is formed on the fifth interlayer insulating film 115. The fifth wiring level 105 is formed to constitute a ferroelectric capacitor 139, particularly, the ferroelectric capacitor 139 is constituted by a laminated structure in which a lower electrode 140 and the upper electrode 141 are overlapped on the same plane and a ferroelectric insulating film 142 of ceramic or the like is interposed between the lower electrode 140 and the upper electrode 141. According to steps of producing the ferroelectric capacitor 139, there is formed a film comprising a noble metal of Pt, Ir, Ru or the like or a conductive oxide of $IrO_2$, $RuO_2$ or the like, next, there is formed a ferroelectric insulating film of PZT[Pb(Zr,Ti)$O_3$], SBT[(SrBi$_2$Ta$_2$O$_9$)], BST[(Ba,Sr)TiO$_3$] or the like thereabove and a film of a material similar to that of the lower electrode is formed thereabove to thereby constitute the laminated structure and the laminated structure is formed in a necessary pattern shape to thereby form the ferroelectric capacitor 139. The lower electrode 140 is connected to the fourth relay wiring 137 by the fifth plug 138. Further, the sixth interlayer insulating film 116 is formed thereabove, an opening is provided above the upper electrode 141 and a conductive material is embedded in the opening to thereby form a sixth plug 143. Next, an aluminum film or an aluminum alloy film is formed on the sixth interlayer insulating film 116 and formed into a necessary pattern by a photolithography step to thereby form a plate line (PL) 144 constituting the sixth wiring level 116. The plate line is connected to the upper electrode. Further, the passivation film 117 is formed on the plate line 144.

When Shadow RAM of the embodiment constituted in this way is compared with conventional type Shadow RAM shown in FIG. 10 through FIG. 12B, the second wiring level 302 and the third wiring level 303 of conventional type Shadow RAM, respectively correspond to the second wiring level 102 and the fourth wiring level 104 of the embodiment, one wiring layer is inserted between the second wiring level 302 and the third wiring level 303 of conventional type Shadow RAM and the inserted wiring layer constitutes the third wiring level 103 of the embodiment. The third wiring level 103 of the embodiment is formed to constitute the third relay wirings 134 and is provided to connect the second relay wiring 132 at the lower layer to the fourth relay wiring 137 and the bit lines 136 at the upper layer. Further, by forming the third relay wiring 134 of the third wiring level 103 by the L-like pattern shape as in the embodiment, a position of the fourth plug 135 on the plane can arbitrarily be changed relative to the third plug 133. Therefore, in the fourth wiring level 104 of the embodiment, the fourth relay wiring 137 for electrically connecting to the ferroelectric capacitor 139, can be arranged between two pieces of the paired bit lines 136 and can be dealt therewith by enlarging the interval between the bit lines 136 within the region of the memory cell MC. Thereby, in comparison with the memory cell conventional type Shadow RAM of FIG. 10 through FIG. 12B, a size LW in the direction of extending the word line can be reduced. As a result, Shadow RAM of the embodiment can be realized while maintaining the size LW in the direction of extending the word line and the size LB in the direction of extending the bit line the same as those of the memory cell of general SRAM which are not provided with the ferroelectric capacitors as shown by FIG. 13 through FIG. 15B.

FIG. 5A is a diagram showing to compare finally connected wiring layers of respective word lines, bit lines, power source lines, GND lines and ferroelectric capacitors of SRAM constituting object in the embodiment, conventional type Shadow RAM and Shadow RAM of the embodiment. Further, Shadow RAM of the embodiment can be constructed by a constitution shown in FIG. 5B as constitution of wiring layers connected to a word line, a bit line and a power source line, a GND line and a ferroelectric capacitor. According to the example, as a first modified example, a bit line is arranged at the third wiring layer, and the fourth wiring layer is arranged with a relay wiring for changing a position of a plug connected to upper and lower wiring layers as a power source line, a GND line and a lead wiring. Further, as a second modified example, the third wiring layer is arranged with a relay wiring as a power source line, a GND line and a lead line and the fourth wiring layer is arranged with a bit line. Even in such a constitution, similar to the embodiment, Shadow RAM which does not enlarge the cell area of the memory cell can be provided. Naturally, respective wirings can be arranged by combinations of wiring layers other than those illustrated in the drawing.

Next, an explanation will be given of a second embodiment of the invention. A second embodiment shown in FIG. 6A through FIG. 8C is an embodiment of applying the invention to SRAM of a three-layers wiring structure explained in the conventional technology. Further, FIGS. 6A and 6B are sectional views of portions along line AA' and line BB' of FIGS. 7A through 8B and respective layout views of FIGS. 7A through 8B show layouts along lines a through e of FIGS. 6A and 6B. As shown by FIGS. 6A and 6B, above the silicon substrate 1, there are laminated a transistor layer 200, a first wiring level 201, a second wiring level 202, a third wiring level 203, a fourth wiring level 204 and a fifth wiring level 205 via a first through a fifth interlayer insulating film 211 through 215. A topmost layer is a passivation film 216.

Figure 7A:
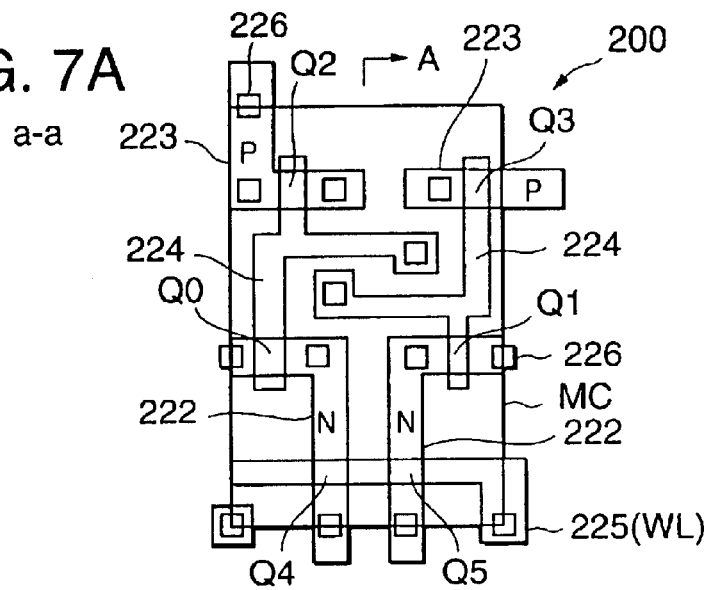
FIGS. 7A through 7C are layout views of layers along respective lines a, b and c of FIGS. 6A and 6B.

FIG. 7A is a view showing the transistor layer 200 which is basically the same as that of the first embodiment, however, pattern shapes of a diffusion layer, a gate electrode and a word line partially differ therefrom. An element isolation insulating film 221 is selectively formed by LOCOS method in one memory cell MC region of the silicon substrate 1 to thereby form a transistor region, thereafter, an N-type impurity of arsenic, phosphor or the like is introduced into a partial region of the transistor region to thereby form an N-type diffusion layer 222 and other region is formed with a P-type diffusion layer 223 by introducing P-type impurity of boron or the like. Further, a gate oxide film and a polysilicon film are formed at a surface of the silicon substrate 1, thereafter, the polysilicon film and the gate oxide film are formed in predetermined patterns by a photolithography step to thereby form the gate electrode 224 and a word line (WL) 225. Thereby, there is formed the transistor layer 200 having PMOS transistors Q2 and Q3 constituting load transistors constituting sources and drains thereof by the P-type diffusion layer 223, NMOS transistors Q0 and Q1 constituting cell transistors constituting source and drains by the N-type diffusion layer 222 and NMOS transistors Q4 and Q5 constituting transfer gates.

Figure 7B:
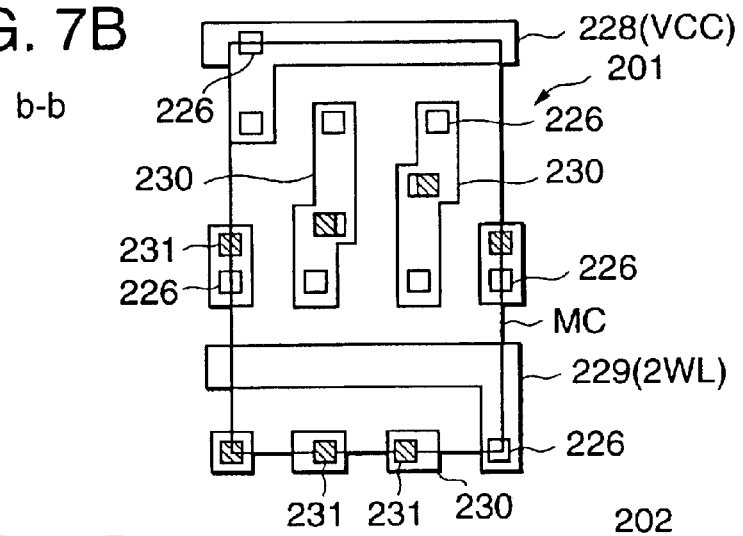

FIG. 7B is a view showing the first wiring level 201 and the first interlayer insulating film 211 of a silicon oxide film is formed on the transistor layer 200. Further, the first interlayer insulating film 211 is provided with openings at regions above the N-type diffusion layer 222 and the P-type diffusion layer 223 and a conductive material of tungsten or the like is embedded in the opening to thereby form the first plug 226. Next, an aluminum film or an aluminum alloy film is formed on the first interlayer insulating film 221 and formed in a necessary pattern shape by a photolithography step to there by form the first wiring level 201. The first wiring level 201 is formed to constitute a power source line (Vcc) 228, a second word line (2 WL) 229, and a first relay wiring 230 and by the first plug 226, and the power source line 228 is connected to the P-type diffusion layer 223, the second word line 229 is connected to the word line 225 of the transistor layer 200, the first relay wiring 230 is connected to the N-type diffusion layer 222, the P-type diffusion layer 223 and the gate electrode 224, respectively.

Figure 7C:
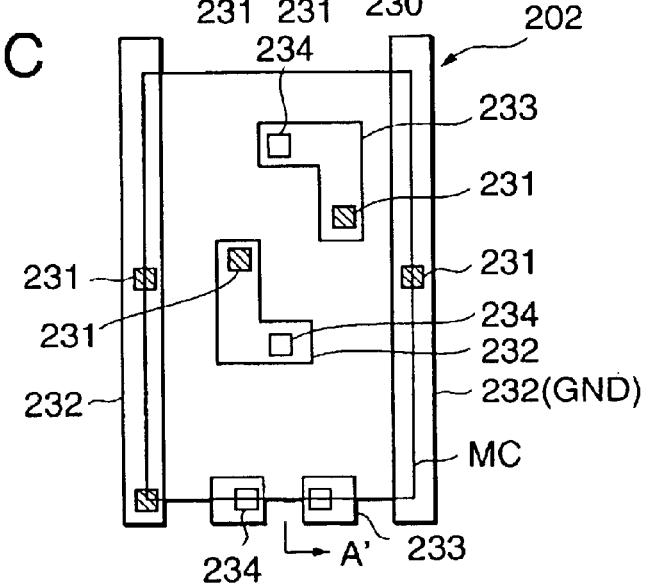

FIG. 7C is a view showing the second wiring level 202 and the second interlayer insulating film 212 of a silicon oxide film is formed on the first wiring level 201. Further, the second interlayer insulating film 212 is provided with an opening at a region above the first relay wiring 230 and a conductive material of tungsten or the like is embedded in the opening to thereby form a second plug 231. Next, an aluminum film or an aluminum alloy film is formed on the second interlayer insulating film 212 and is formed in a necessary pattern shape by a photolithography step to thereby form the second wiring level 202. The second wiring level 202 is formed to constitute a GND line 232 and a second relay wiring 233, which are respectively connected to the first relay wiring 230 by the second plug 231. Particularly, the second relay wiring 233 is formed in an L-like pattern shape such that a position of a third plug 234 connected to the wiring layer of an upper layer, mentioned later, on the plane, significantly differs from that of the second plug 231 connected to the wiring layer at a lower layer, as a lead wiring layer. That is, the second relay wiring 233 is formed in a shape such that the third plug 234 can be arranged in a space between wirings 235 formed at the third wiring level 203.

Figure 8A:
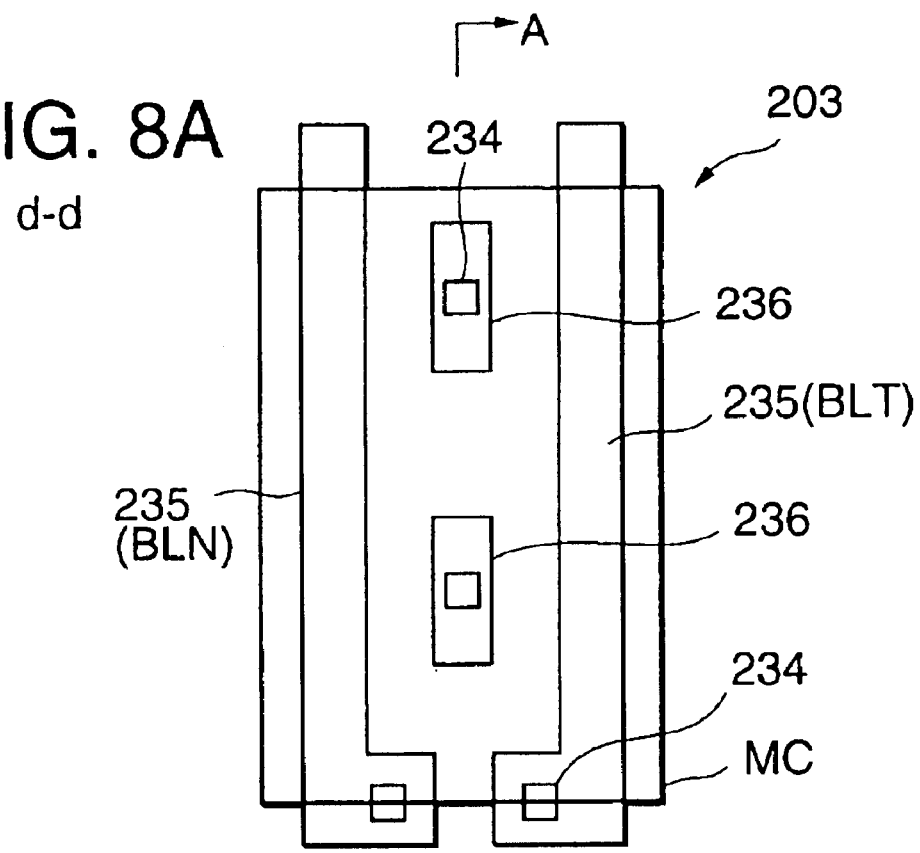
FIGS. 8A and 8B are layout views of layers along respective lines d and e of FIGS. 6A and 6B.

FIG. 8A is a view showing the third wiring level 230 and the third interlayer insulating film 213 of a silicon oxide film is formed on the second wiring level 202. Further, the third interlayer insulating film 213 is provided with an opening at a region above the second relay wiring and a conductive material of tungsten or the like is embedded in the opening to thereby form a third plug 234. Next, an aluminum film or an aluminum alloy film is formed on the third interlayer insulating film 213 and is formed in a necessary pattern shape by a photolithography step to thereby form the third wiring level 203. The third wiring level 203 is formed to constitute the bit lines (BLN, BLT) 235 and a third relay wiring 236. The third relay wiring 236 is connected to the second relay wiring 233 by the third plug 234.

Figure 8B:
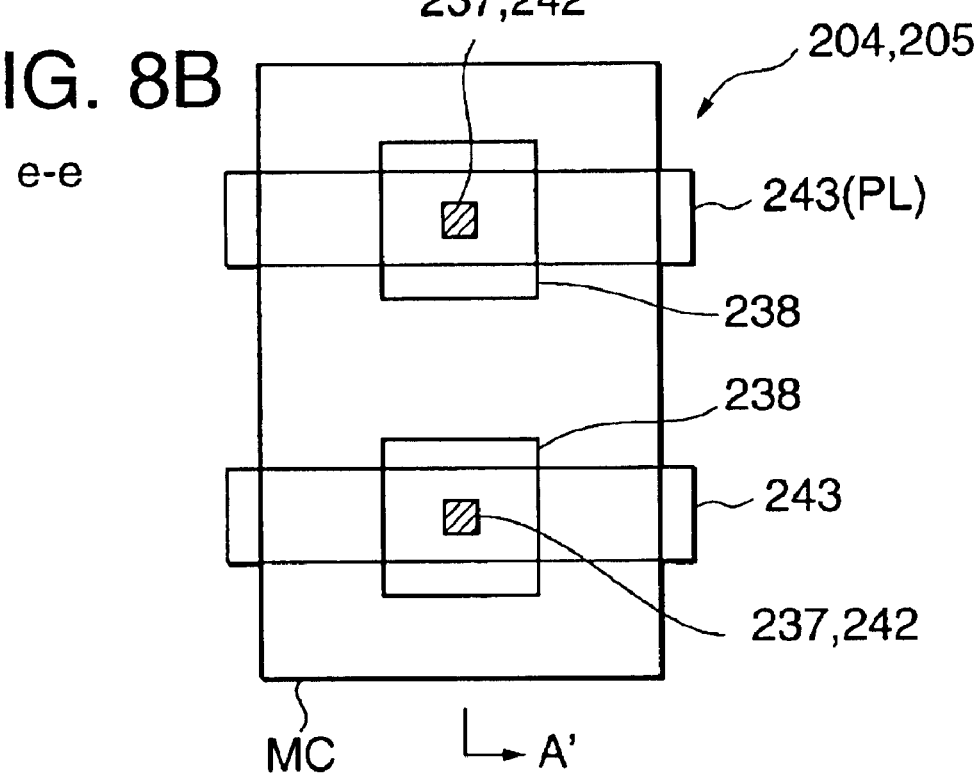
Figure 10:
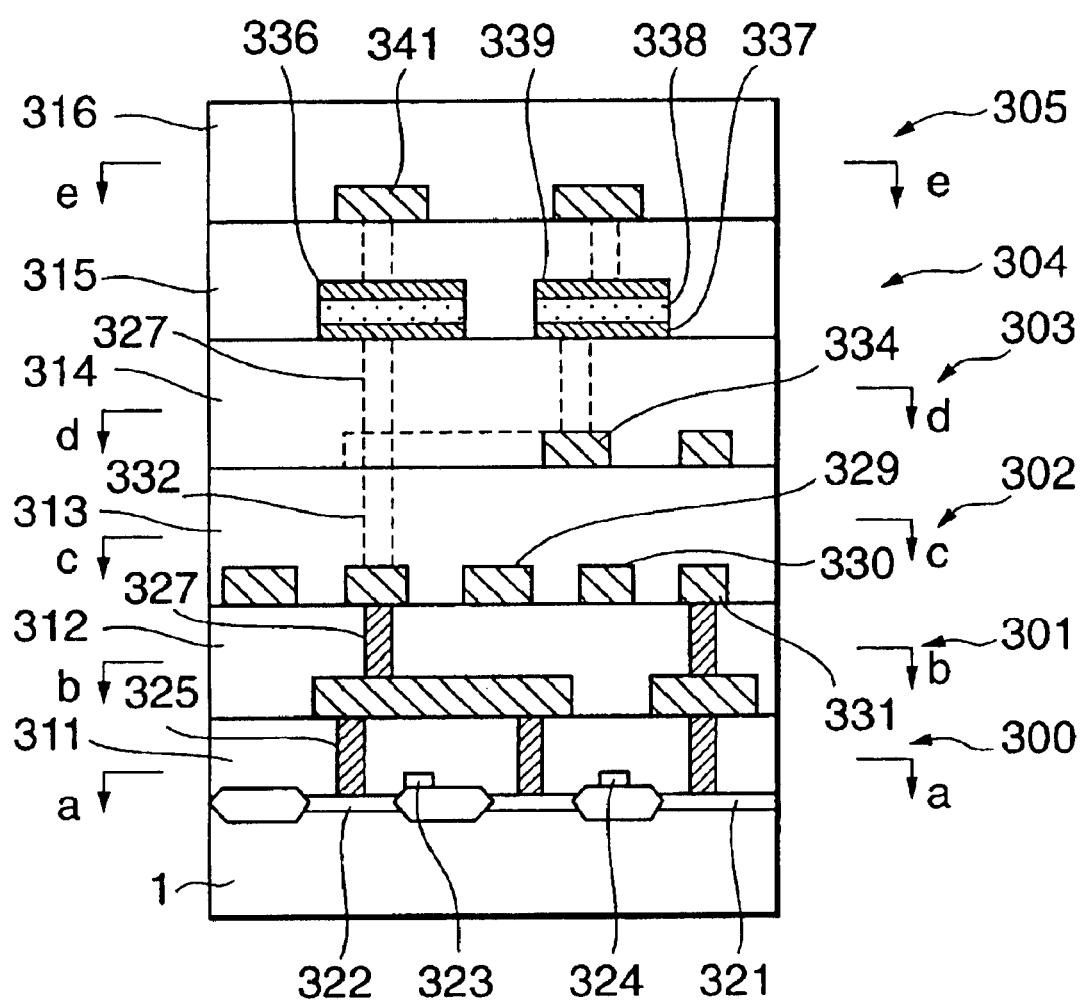
FIG. 10 is a vertical sectional view in a direction of extending a bit line of conventional Shadow RAM.
Figure 11A:
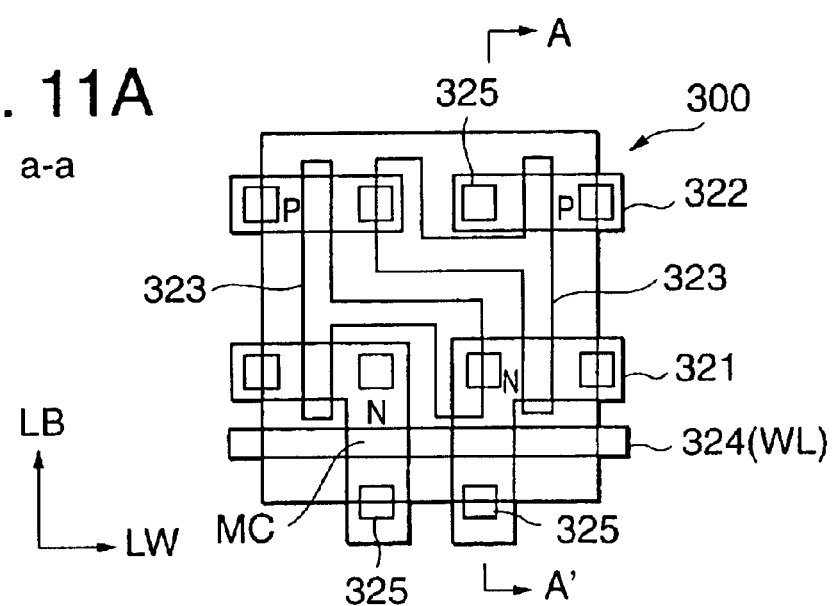
FIGS. 11A through 11C are layout views of layers along respective lines a, b, and c of FIG. 10.
Figure 11B:
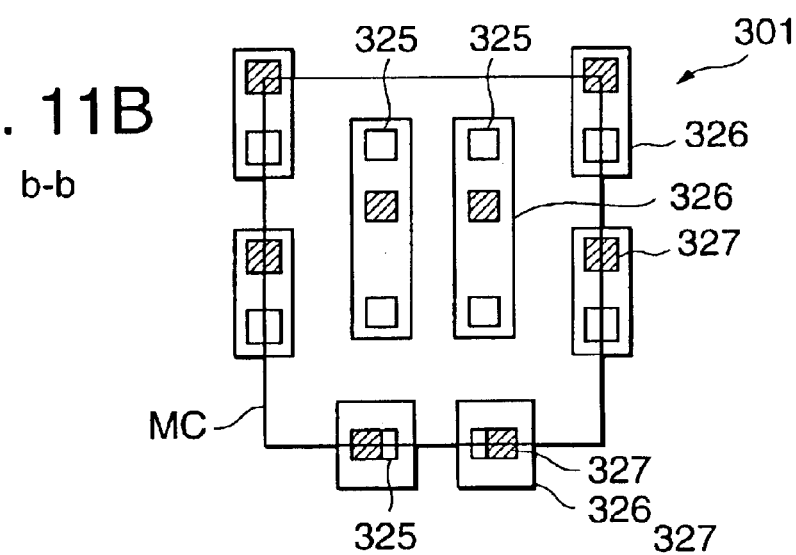
Figure 11C:
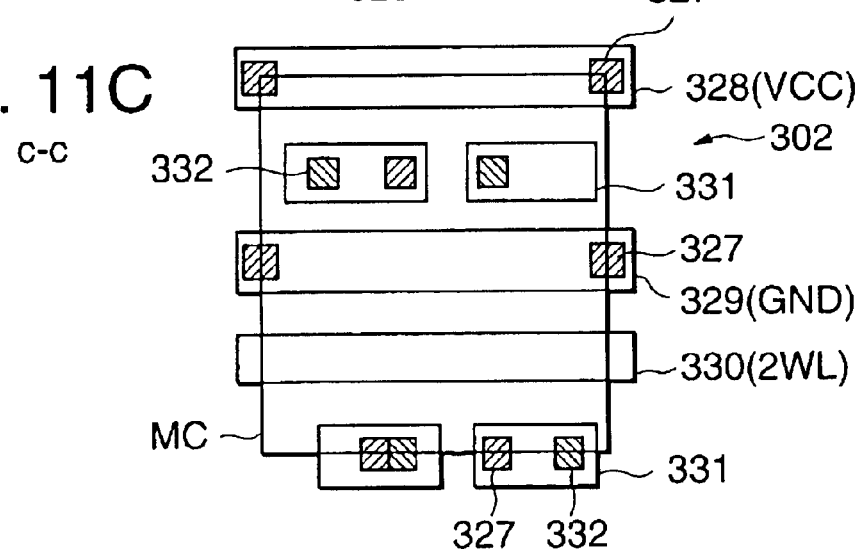
Figure 13:
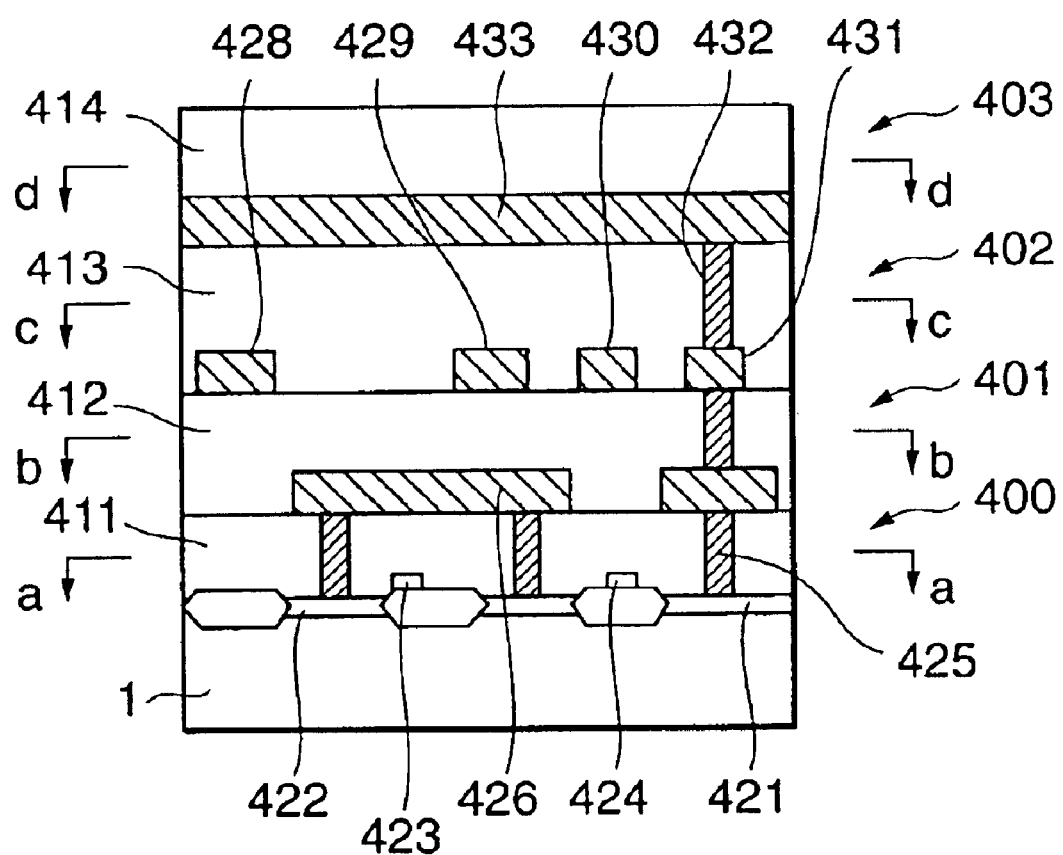
FIG. 13 is a vertical sectional view in a direction of extending a bit line of conventional SRAM.
Figure 14A:
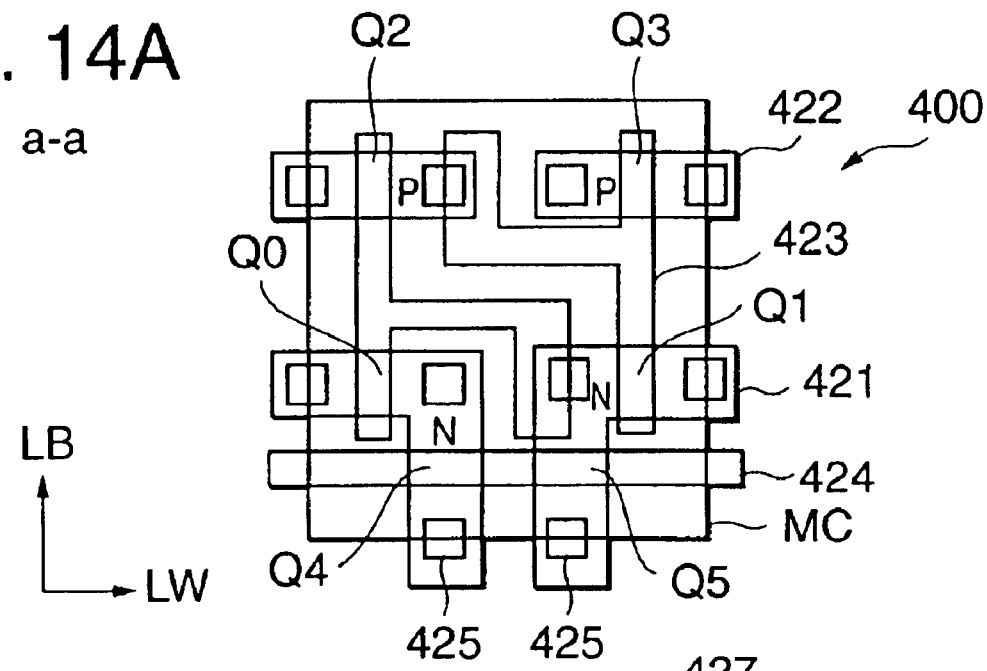
FIGS. 14A and 14B are layout views of layers along respective lines a and b of FIG. 13.
Figure 14B:
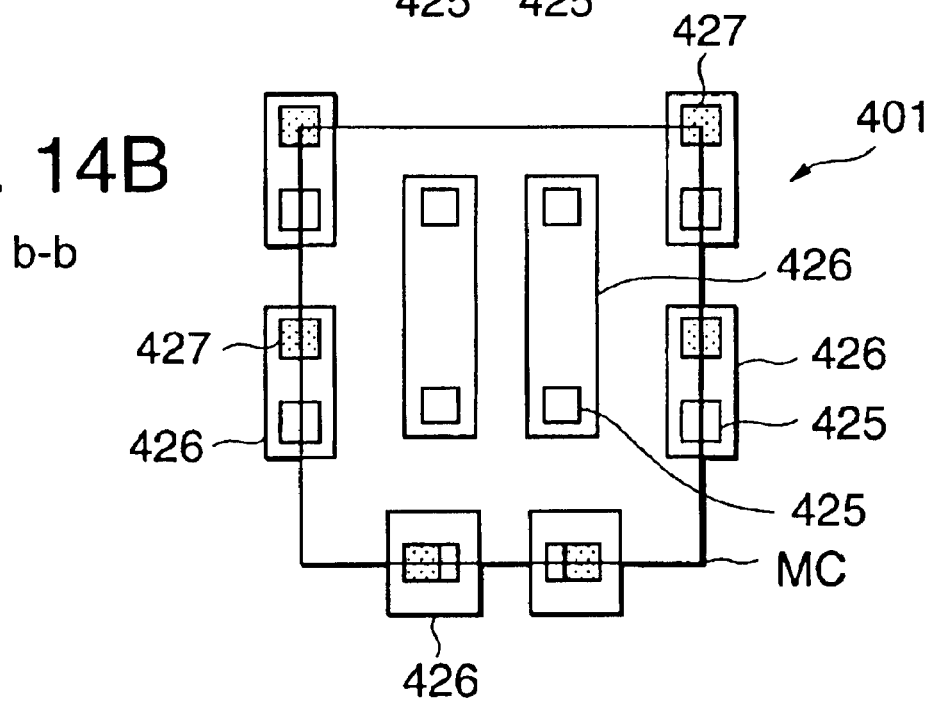
Figure 15A:
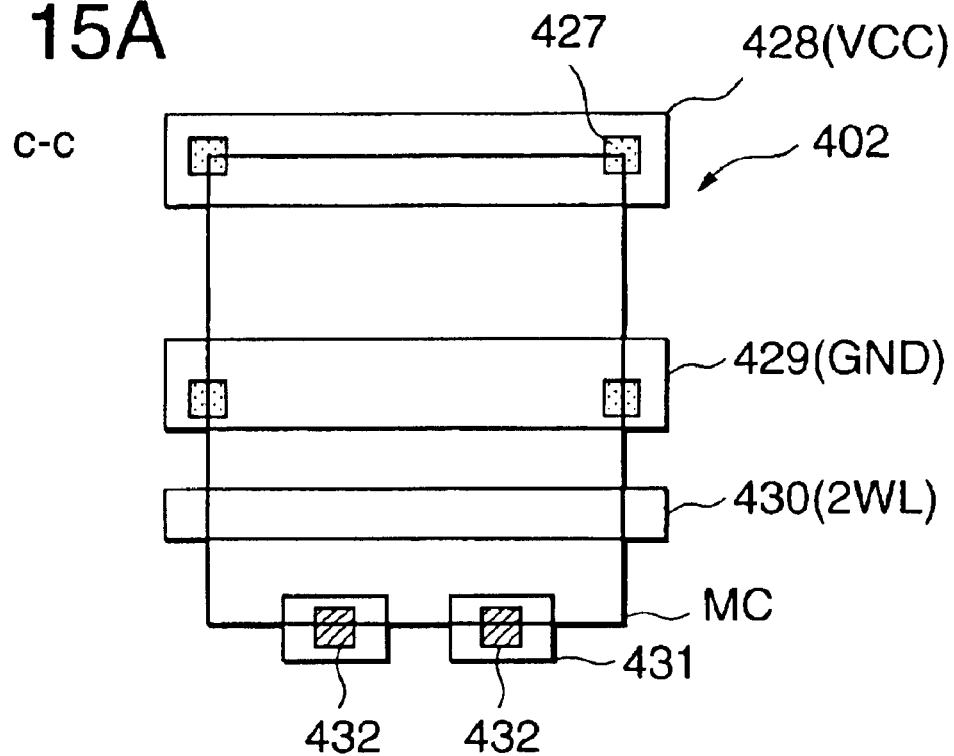
FIGS. 15A and 15B are layout views of layers along respective lines c and d of FIG. 13.
Figure 15B:
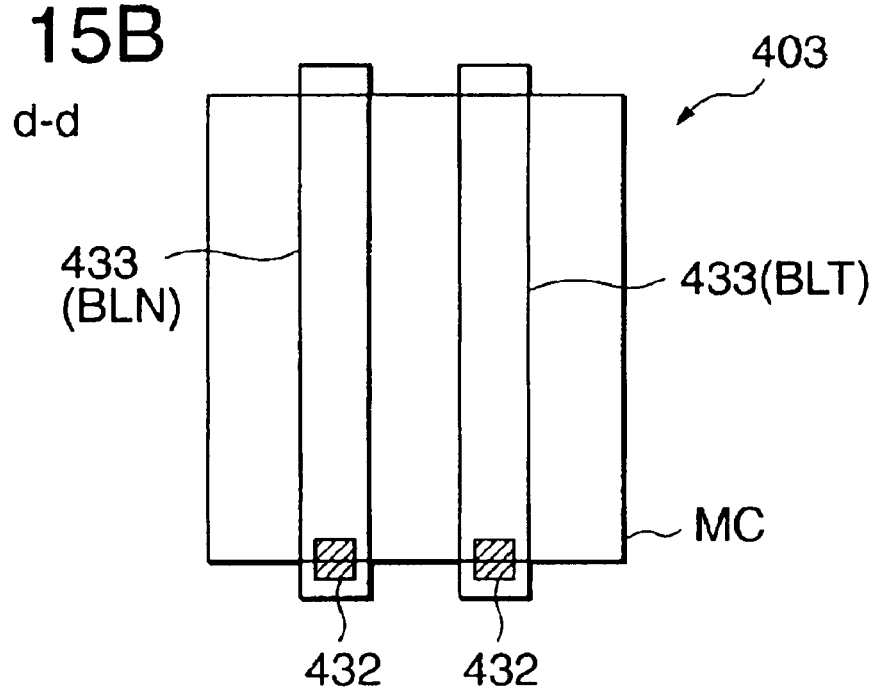
Figure 17A:
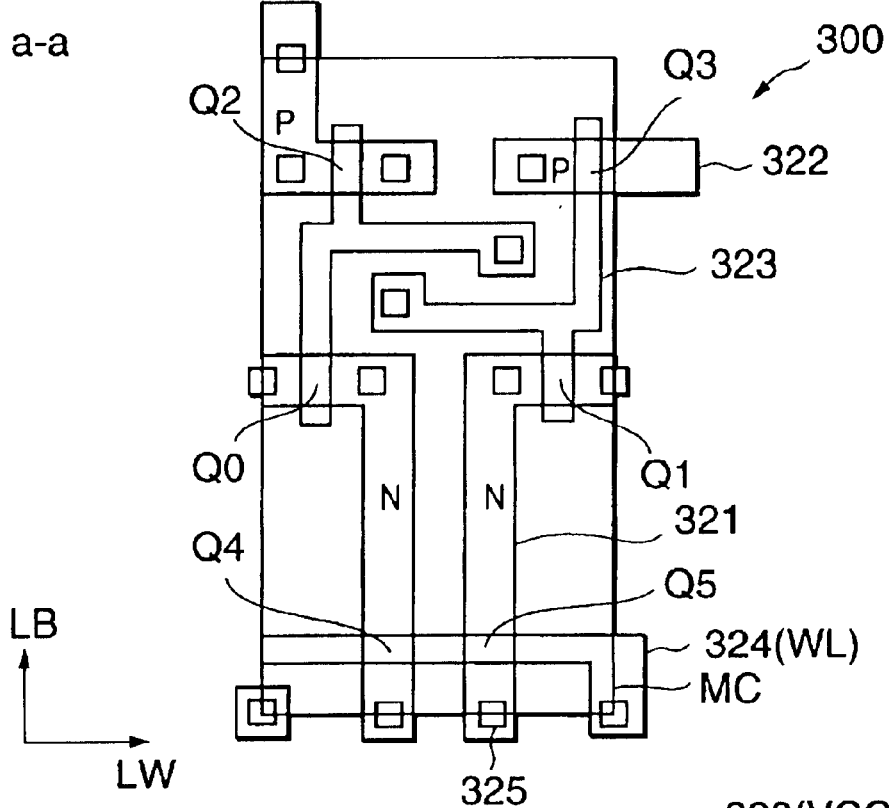
FIGS. 17A and 17B are layout views of a transistor layer and a first wiring layer of different conventional Shadow RAM.
Figure 17B:
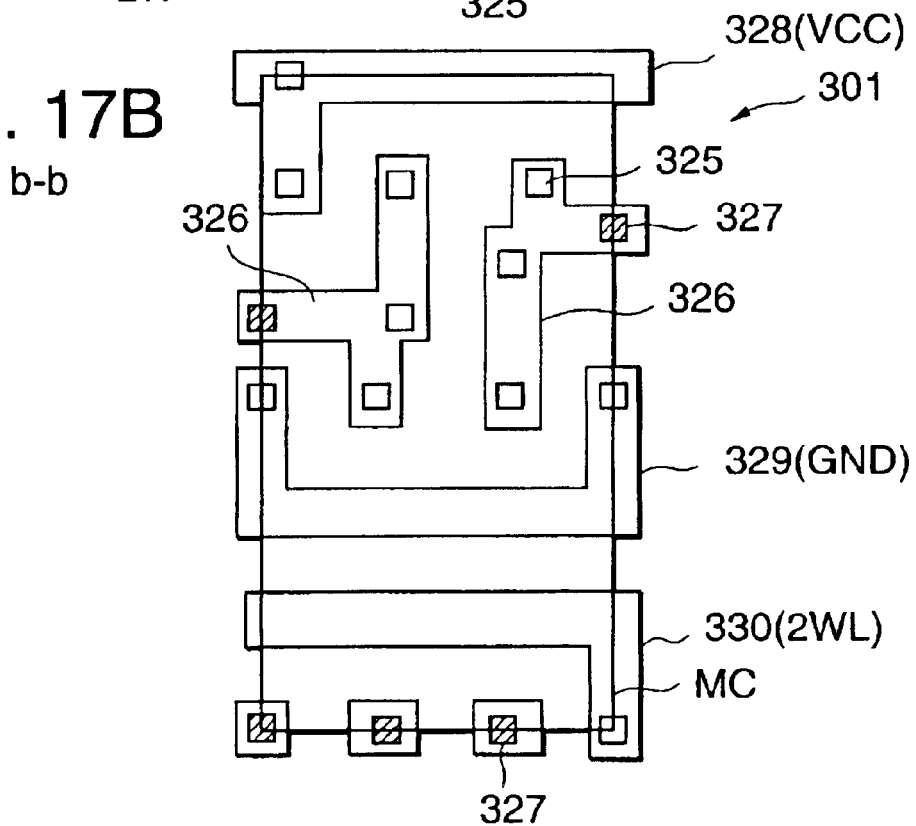
Figure 18A:
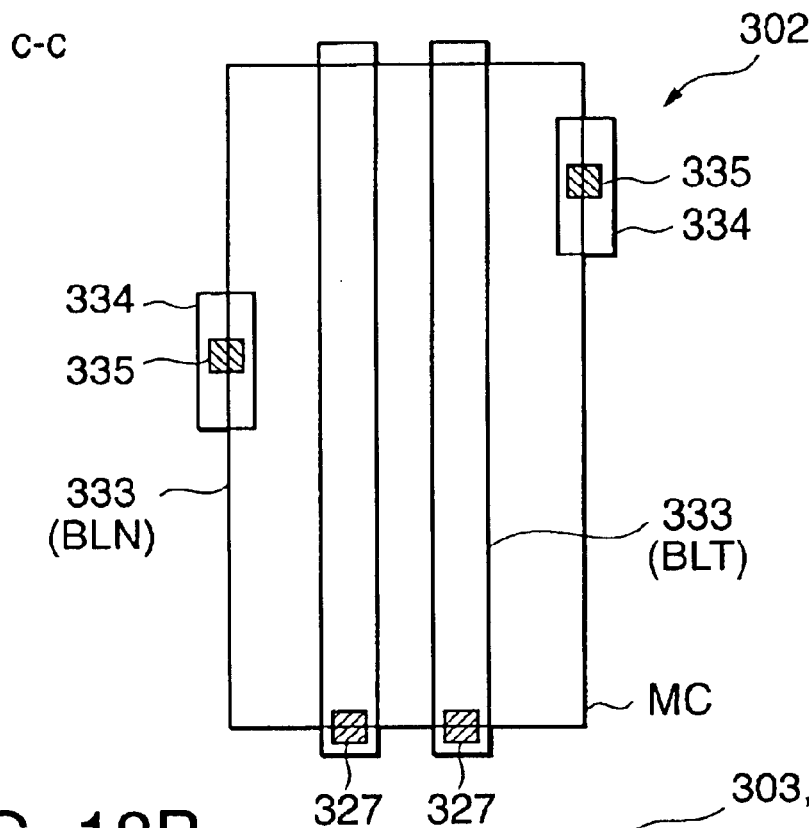
FIGS. 18A and 18B are layout views of a second wiring layer and a third wiring layer of the different conventional Shadow RAM.
Figure 18B:
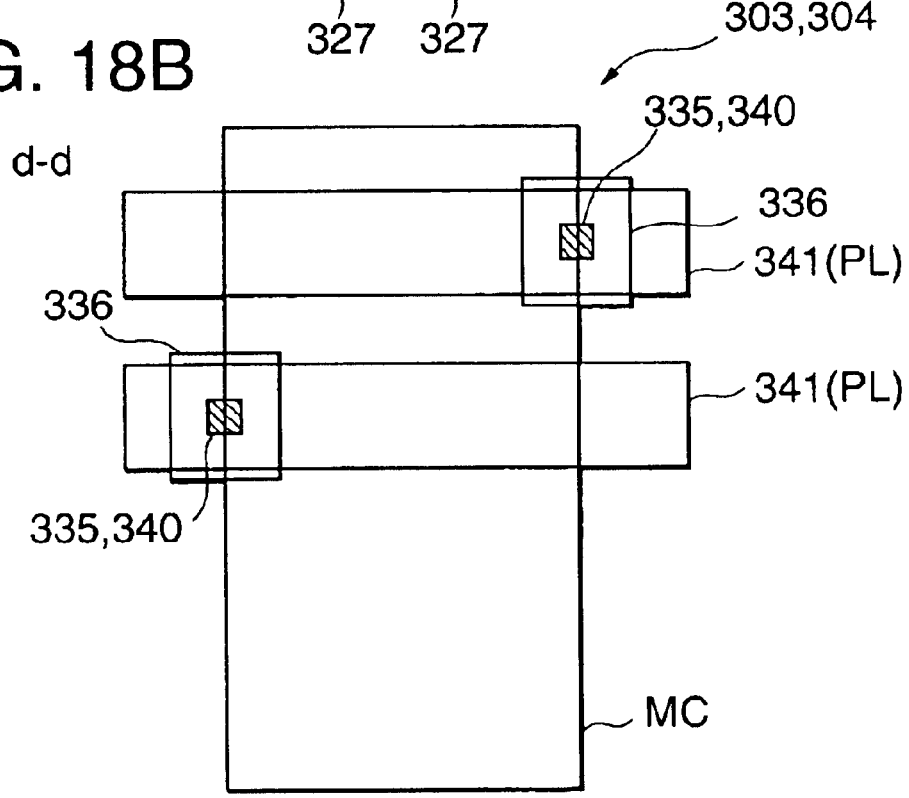

FIG. 8B is a diagram summarizingly showing the fourth wiring level 204 and the fifth wiring level 205 and the fourth interlayer insulating film 214 of a silicon oxide film is formed on the third wiring level 203. Further, the fourth interlayer insulating film 214 is provided with an opening at a region above the third relay wiring 236 and a conductive material is embedded in the opening to thereby form a fourth plug 237. Next, a conductive film, a ferroelectric insulating film and a conductive film are successively formed in a laminated state and on the fourth interlayer insulating film 21, formed in a necessary pattern shape by a photolithography step to thereby form a ferroelectric capacitor 238 comprising a lower electrode 239 and an upper electrode 240 and a ferroelectric insulating film 241 between the two electrodes. Further, the fifth interlayer insulating film 215 is formed thereabove, an opening is provided at a region above the ferroelectric capacitor 238 and a conductive material is embedded in the opening to thereby form a fifth plug 242. Next, a conductive film is formed above the fifth interlayer insulating film 215 and is formed in a necessary pattern shape by a photolithography step to thereby form a plate line 243 constituting the fifth wiring level 205 connected to the upper electrode 241 of the ferroelectric capacitor 238. Further, the passivation film 216 is formed on the plate line 243.

When Shadow RAM of the embodiment is constituted in this way is compared with conventional type Shadow RAM shown in FIGS. 17A through 18B, Shadow RAM of the embodiment is constructed by a constitution equivalent to a constitution of dividing wirings of the first wiring level 301 of conventional type Shadow RAM into the first wiring level 201 and the second wiring level 202 of Shadow RAM of the embodiment. The first wiring level 201 of the embodiment is formed to constitute the power source line 228, the second word line 229 and the first relay wiring 230 and the second wiring level 202 is formed to constitute the GND line 232 and the second relay wiring 233. Particularly, by forming the first relay wiring 230 and the second relay line 233 in arbitrary pattern shapes of a crank shape and an L-like shape, a position of the second plug 231 to be connected to the second wiring level 202 on the plane can arbitrarily be changed relative to the first plug 226 to be connected to the transistor layer 200. Therefore, according to the second wiring level 202 of the embodiment, there is an allowance in a space between the GND lines 232 and the second relay wiring 233 for electrically connecting to the ferroelectric capacitor 238 at the upper layer, can be arranged between the GND lines. Thereby, in comparison with the memory cell of conventional type Shadow RAM, the size LB in a direction of extending the bit line can be reduced, as a result, Shadow RAM of the embodiment can be realized by a size the same as that of the memory cell of general SRAM which is not provided with the ferroelectric capacitor shown in FIGS. 16A, 16B and 16C.

FIG. 9A is a view showing to compare finally connected wiring layers to word lines, bit lines, power source lines, GND lines and ferroelectric capacitors of SRAM constituting an object of the embodiment, conventional type Shadow RAM and Shadow RAM of the embodiment. Further, Shadow RAM of the embodiment can be constructed by a constitution shown in FIG. 9B as a constitution of connecting wiring layers to a word line, a bit line a power source line, a GND line and a ferroelectric capacitor. According to the example, as a first modified example, the first wiring layer is arranged with a relay wiring for changing a position of a plug connected to the upper and lower wiring layers as a lead wiring, the second wiring layer is arranged with a bit line, and the third wiring layer is arranged with a power source line and a GND line. Further, as a second modified example, the second wiring layer is arranged with a power source line, a GEDN line and a relay wiring constituting a lead wiring and the third wiring layer is arranged with a bit line. Even by such a constitution, similar to the embodiment, Shadow RAM which does not enlarge the cell area of the memory cell can be provided. Naturally, the respective wirings can be arranged by combinations of the wiring layers other than those shown in the drawings.

Here, the upper electrode constituting the ferroelectric capacitor may be formed integrally with the plate line and in this case, the ferroelectric capacitor and the plate line are constituted as the same wiring layer. The topmost wiring layer having the plate line and the wiring layer having the ferroelectric capacitor right therebelow are summarizingly illustrated in the first and the second embodiments from such reason. When the constitution is constructed, the step of forming the ferroelectric capacitor and the upper electrode becomes more or less complicated, however, the sixth interlayer insulating film 216 and the sixth plug 143 of the first embodiment and the fifth interlayer insulating film and the fifth plug 242 of the second embodiment can be omitted and the structure can be restrained from being complicated by canceling an amount of an increase in a number of the wiring levels of Shadow RAM of the invention more than the number of the wiring levels of conventional Shadow RAM.

The layouts of the transistor layers and the respective wiring layers of the first and the second embodiments show representative examples of Shadow RAM of the invention and arrangement of MOS transistors and pattern shapes of respective wirings connected there to can naturally be changed pertinently.

As has been explained above, according to the invention, the memory cell size of the conventional type Shadow RAM is made the same as the memory size of SRAM and therefore, even when the layouts of the wiring layer of the upper layer and the wiring layer of the lower layer of conventional type Shadow RAM are maintained to layouts the same as the layouts of corresponding wiring layers of the memory cell of SRAM, Shadow RAM can be realized and Shadow RAM of the invention can be realized with the same size as that of the memory cell of SRAM. Thereby, by using the design data of an existing transistor layer applied to conventional general SRAM as it is, Shadow RAM can be designed and the degree of freedom of design is promoted, a number of steps of design is reduced and a time period of design is shortened and a semiconductor memory apparatus having large storage capacity can be realized.

It is apparent that the present invention is not limited to the above embodiments, but may be modified and changed without departing from the scope and spirit of the invention.

What is claimed is:

1. A semiconductor memory device comprising:
   an SRAM memory including an SRAM memory cell; and
   a Shadow RAM including a ferroelectric capacitor and an SRAM memory cell;
   wherein a cell area of said Shadow RAM is substantially equal to a cell area of said SRAM memory.

2. The semiconductor memory device according to claim 1:
   wherein a number of wiring layers constituting a portion of said SRAM memory cell of said Shadow RAM is larger than a number of wiring layers constituting said SRAM memory cell of said SRAM memory.

3. The semiconductor memory device according to claim 1:
   wherein a relay wiring layer is provided between a wiring layer constituting a portion of said SRAM memory cell of said Shadow RAM and a wiring layer constituting a portion of the ferroelectric capacitor thereof.

4. A semiconductor memory device comprising:
   a Shadow RAM comprising a portion of a SRAM memory cell and a ferroelectric capacitor connected to a storage node of said portion of said SRAM memory cell;
   wherein said Shadow RAM is provided with a relay wiring layer between a wiring corresponding to the storage node and a lower electrode of the ferroelectric capacitor;
   wherein said wiring corresponding to said storage node is connected to a relay wiring of said relay wiring layer via a first and second opening portion arranged in a first direction at a first interval; and
   wherein said lower electrode is connected to said relay wiring via a third and a fourth opening portion arranged in said first direction at a second interval shorter than said first interval.

5. The semiconductor memory device according to claim 4:
   wherein said relay wiring layer is a wiring layer different from a wiring layer corresponding to a pair of bit lines of the Shadow RAM.

6. The semiconductor device according to claim 4:
   wherein both of said third and said fourth opening portions are disposed between wirings corresponding to said pair of bit lines.

7. The semiconductor memory device according to claim 4:
   wherein the relay wiring is formed in a shape such that said first and said second opening portions and said third and said fourth opening portions are disposed at different positions.

8. The semiconductor memory apparatus according to claim 4:
   wherein said ferroelectric capacitor is constituted by said lower electrode, a ferroelectric insulating film formed on said lower electrode and an upper electrode formed on said ferroelectric insulating film and said upper electrode is constituted by a wiring layer the same as a wiring layer of a plate wiring to be connected to said upper electrode.

9. The semiconductor memory device according to claim 4:
   wherein said semiconductor memory device further comprises an SRAM memory cell and a memory cell area of said Shadow RAM and a memory cell area of said SRAM are substantially equal to each other.

10. A semiconductor memory device comprising:
    a SRAM memory including a first SRAM memory cell; and
    a shadow RAM including a ferroelectric capacitor and a second SRAM memory cell spaced from said first SRAM memory cell;
    wherein a cell area of said shadow RAM is substantially equal to a cell area of said SRAM memory.

* * * * *